(12) United States Patent
Kumagai

(10) Patent No.: US 8,087,962 B2
(45) Date of Patent: Jan. 3, 2012

(54) MANUFACTURING METHOD OF DISPLAY APPARATUS

(75) Inventor: Minoru Kumagai, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 206 days.

(21) Appl. No.: 12/211,230

(22) Filed: Sep. 16, 2008

(65) Prior Publication Data

US 2009/0070995 A1 Mar. 19, 2009

(30) Foreign Application Priority Data

Sep. 18, 2007 (JP) ................................. 2007-240627

(51) Int. Cl.
*H01J 9/38* (2006.01)

(52) U.S. Cl. .............................. 445/13; 445/24; 313/504

(58) Field of Classification Search .................. 313/503, 313/504; 427/58; 428/209; 445/24, 13
See application file for complete search history.

(56) References Cited

U.S. PATENT DOCUMENTS

| 7,291,970 | B2 | 11/2007 | Kuwabara |
| 7,294,856 | B2 | 11/2007 | Ito et al. |
| 2003/0087073 | A1* | 5/2003 | Kobayashi ..................... 428/209 |
| 2003/0143339 | A1 | 7/2003 | Kobayashi |
| 2004/0119403 | A1 | 6/2004 | McCormick et al. |
| 2005/0068476 | A1* | 3/2005 | Okabe ............................. 349/96 |
| 2005/0079277 | A1 | 4/2005 | Takashima et al. |
| 2005/0112341 | A1 | 5/2005 | Ito et al. |
| 2006/0098521 | A1 | 5/2006 | Shimoda et al. |
| 2006/0220532 | A1 | 10/2006 | Tanabe et al. |
| 2007/0019032 | A1 | 1/2007 | Maekawa et al. |
| 2007/0057627 | A1 | 3/2007 | Kidu et al. |
| 2007/0071885 | A1 | 3/2007 | Kumagai |
| 2007/0264899 | A1 | 11/2007 | Kumagai |
| 2008/0030118 | A1 | 2/2008 | Ham |
| 2008/0030119 | A1 | 2/2008 | Ito et al. |

FOREIGN PATENT DOCUMENTS

| JP | 8-015504 A | 1/1996 |
| JP | 11-192450 A | 7/1999 |
| JP | 2001-76881 A | 3/2001 |
| JP | 2003-203766 A | 7/2003 |
| JP | 2003-224349 A | 8/2003 |
| JP | 2003-257656 A | 9/2003 |

(Continued)

OTHER PUBLICATIONS

Japanese Office Action dated Oct. 15, 2009 and English translation thereof issued in a counterpart Japanese Application No. 2007-240627.

(Continued)

*Primary Examiner* — Nimeshkumar Patel
*Assistant Examiner* — Mary Ellen Bowman
(74) *Attorney, Agent, or Firm* — Holtz, Holtz, Goodman & Chick, PC

(57) ABSTRACT

A manufacturing method of a display apparatus which comprises a plurality of display pixels including light emitting elements having a carrier transport layer includes first causing a surface of an electrode formed in a forming region of the plurality of display pixels by being enclosed by a partition wall which is provided on a substrate to have a lyophilic characteristic, making a surface of the partition wall have a repellency characteristic and second causing the surface of the electrode to have the lyophilic characteristic again by carrying out a plasma treatment in an inert gas atmosphere.

22 Claims, 11 Drawing Sheets

FOREIGN PATENT DOCUMENTS

| | | | |
|---|---|---|---|
| JP | 2003-347063 A | | 12/2003 |
| JP | 2004-106320 A | | 4/2004 |
| JP | 2005-038634 A | | 2/2005 |
| JP | 2005-116313 A | | 4/2005 |
| JP | 2005-174906 A | | 6/2005 |
| JP | 2005-251768 A | | 9/2005 |
| JP | 2006-098977 A | | 4/2006 |
| JP | 2006-119618 A | | 5/2006 |
| JP | 2006-337935 A | | 12/2006 |
| JP | 2007-111646 A | | 5/2007 |
| JP | 2007111646 A | * | 5/2007 |
| KR | 2005-0053640 A | | 6/2005 |
| WO | WO 2004/061992 A1 | | 7/2004 |

OTHER PUBLICATIONS

Japanese Office Action dated Apr. 28, 2008 and English translation thereof issued in Japanese Application No. 2006-131002, which is a Japanese counterpart of related U.S. Appl. No. 11/801,696.

Japanese Office Action dated Apr. 28, 2008 and English translation thereof issued in Japanese Application No. 2006-152964, which is a Japanese counterpart of related U.S. Appl. No. 11/801,696.

Korean Office Action dated Apr. 18, 2008 and English translation thereof issued in Korean Application No. 2007-0045690, which is a Korean counterpart of related U.S. Appl. No. 11/801,696.

U.S. Appl. No. 11/523,400; First Named Inventor: Minoru Kumagai; Title: "Display Device and Method of Manufacturing the Same": filed Sep. 19, 2006.

U.S. Appl. No. 11/801,696; First Named Inventor: Minoru Kumagai; Title: "Display Device and Manufacturing Method Thereof"; filed May 10, 2007.

* cited by examiner

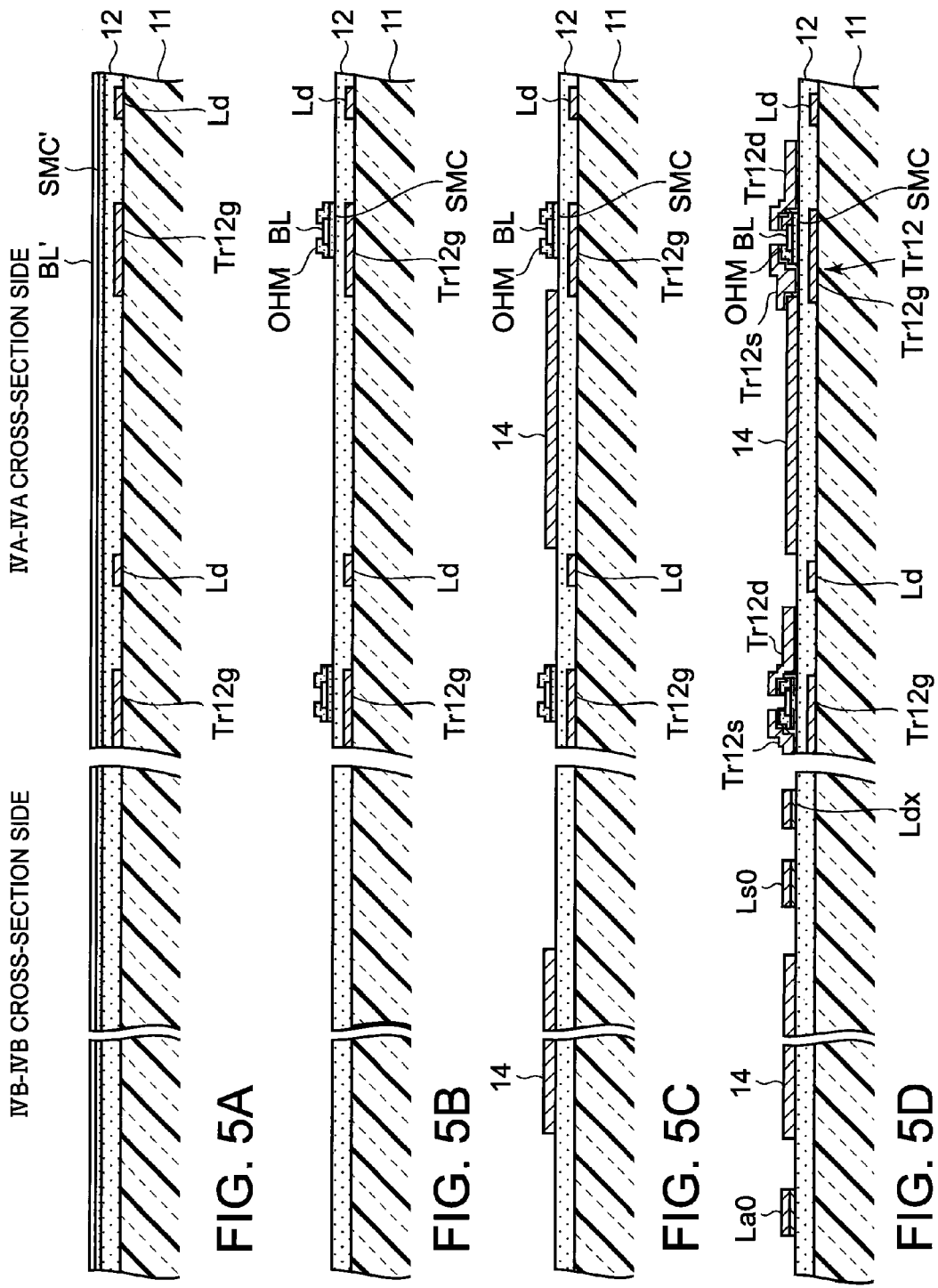

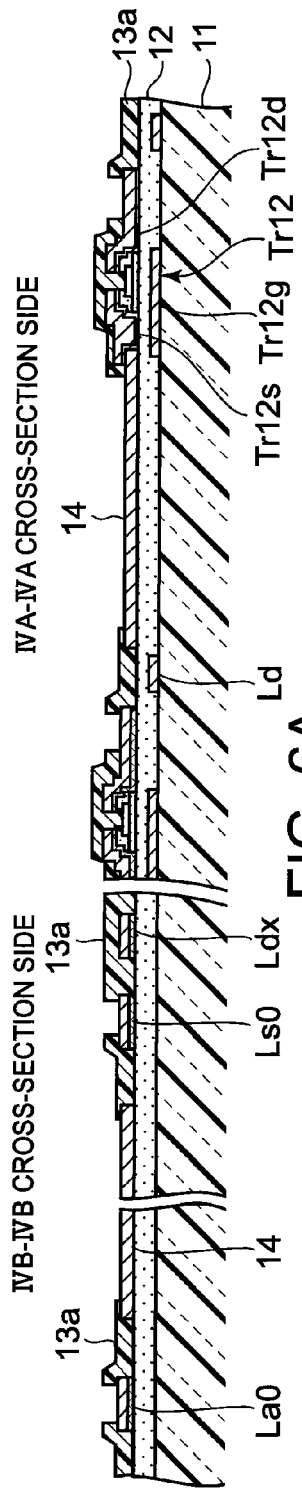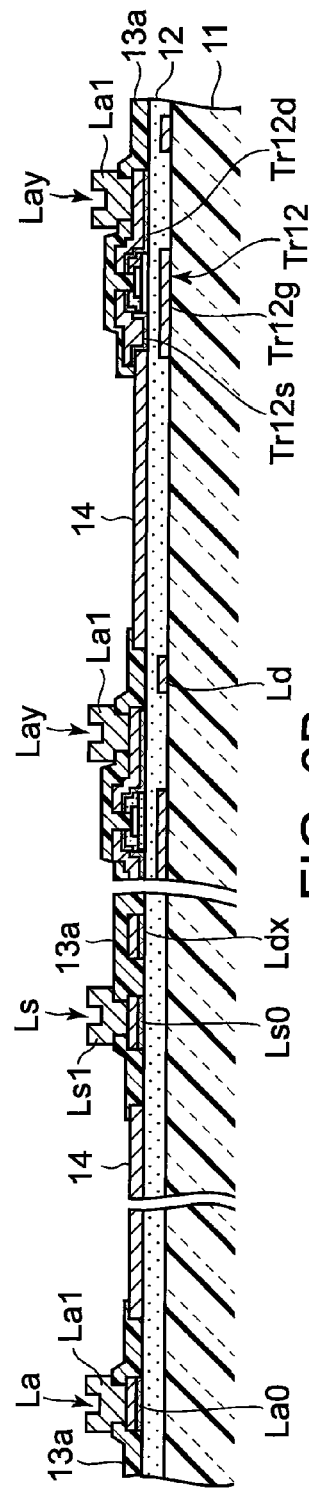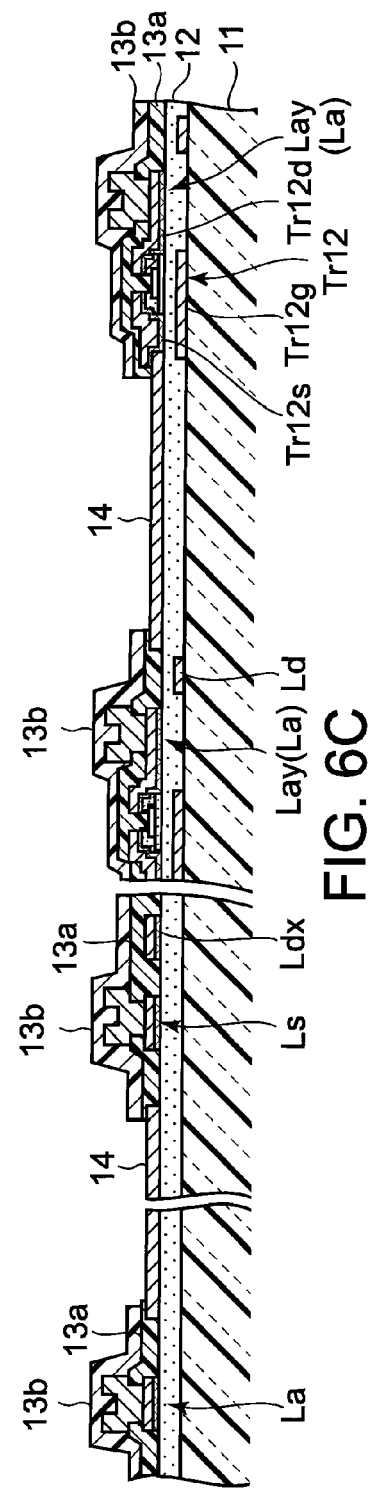

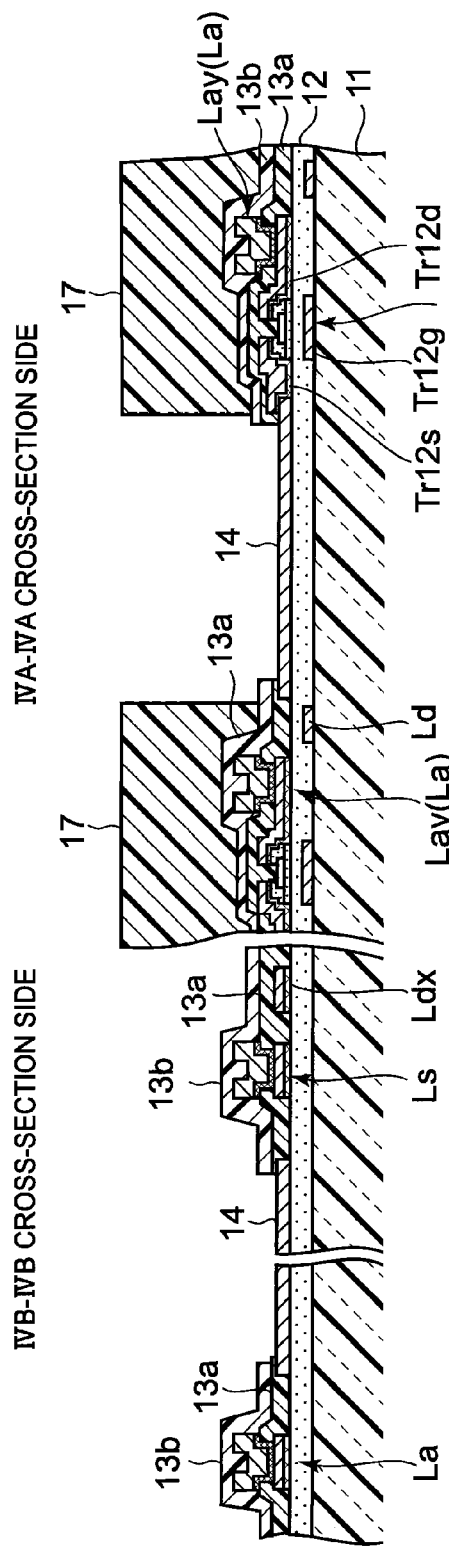
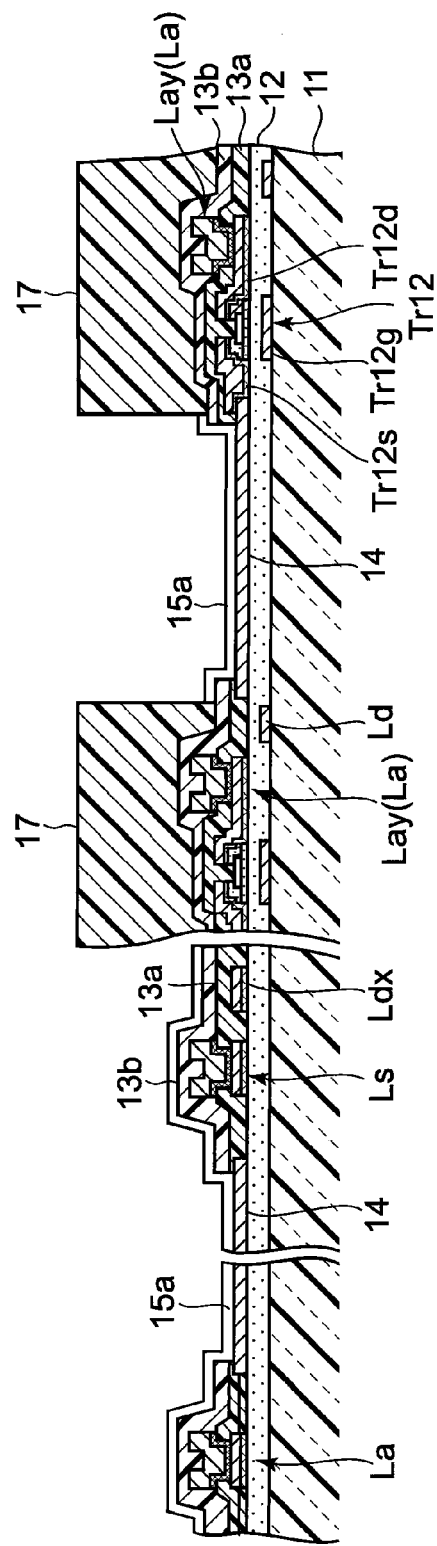
FIG. 7A
FIG. 7B

MANUFACTURING METHOD OF DISPLAY APPARATUS

BACKGROUND OF THE INVENTION

1. Field of the Invention

The present invention relates to a manufacturing method of a display apparatus, particularly to a manufacturing method of a display apparatus which comprises a display panel in which a plurality of display pixels having a light emission device in which a carrier transport layer is formed by applying a liquid material including a carrier transporting material are two-dimensionally arranged.

2. Description of Related Art

In recent years, a display device which comprises a display panel (organic EL display panel) in which organic electroluminescent devices (hereinafter, abbreviated as "organic EL device") which are self light emitting elements are two-dimensionally arranged is know as the display device for electronic devices such as a cell phone, a portable music player and the like. Particularly, the display response rate is faster and the view angle dependence is smaller in the organic EL display panel of an active matrix drive type comparing to the widely used liquid display apparatus, and also the backlight, the light guide plate or the like which is required in the liquid crystal display apparatus is not needed in the organic EL display panel. Therefore, there is a possibility that the organic EL display panel can be even thinner and lighter. Thus, the organic EL display panel is expected to be used in various types of electronic devices in the future.

Here, as widely known, the organic EL device has a device structure in which the anode (positive) electrode, the organic EL layer (light emitting function layer) and the cathode (negative) electrode are orderly layered in a stacking manner on one side of glass substrate or the like. Further, the organic EL device emits light (excitation light) based on energy generated when holes and electrons which are injected are recombine in the organic EL layer by applying positive voltage to the anode electrode and negative voltage to the cathode electrode so as to exceed the light emission threshold in the organic EL layer. The organic EL device can be classified in the organic EL device of low molecular system and the organic EL device of high molecular system according to the organic material (hole transporting material and electron transporting material) which forms the carrier transport layer which becomes the organic EL layer.

In case of the organic EL device which uses the organic material of low molecular system, the deposition method is used in the manufacturing process in general. When the organic film of low molecular system is being selectively formed only on the anode electrode of the pixel forming region, a mask for preventing the deposition of the low molecular material to the region other than the anode electrode is used, and there is a problems that the material loss at the time of manufacturing is great because the low molecular material also attaches on the surface of the mask and that the manufacturing process is inefficient.

On the other hand, in case of the organic EL device which uses the organic material of high molecular system, the inkjet method (liquid drop discharging method), the nozzle printing method (liquid flow discharging method) or the like can be applied as the wet type film forming method in general. Therefore, the solution of the above organic material can be selectively applied only to the anode electrode or to the specified region including the anode electrode. Thus, the thin film of the organic EL layer (the hole transport layer, the electron transport layer, the light emission layer and the like) can be formed in a great accuracy by the effective manufacturing process in which the material loss is small.

In such organic EL display panel of high molecular system, there is known an organic EL display panel having a panel structure in which a partition wall which is continuously formed and which protrudes on the insulative substrate is provided between each pixel forming regions in order to prevent the phenomenon in which the mixing of colors (color mixing) of the light emitting colors occurs between in display pixels by the light emitting material in different colors being mixed into the adjacent pixel forming regions when the forming region (pixel forming region) of each display pixel to be arranged on the insulative substrate is being defined and when the liquid material including the organic material of high molecular system is being applied. Such organic EL display panel comprising the partition wall is described in detail in JP2001-76881A, for example.

However, in the above described organic EL device of high molecular system or in some of the organic EL device of low molecular system, there is a problem that mixing (color mixing) of the light emitting colors occur between the display pixels by the light emitting material of different colors mixing into the adjacent pixel forming regions or there is a problem that the film thickness of the organic EL layer which is formed in the pixel forming region is uneven due to the surface tension, the cohesion force and the like when the organic EL layer (the hole transport layer, the electron transport layer, and the light emission layer) is being manufactured by using the wet film forming method such as the inkjet method, the nozzle printing method or the like. The surface tension, the cohesion force and the like are caused by the characteristic (the lyophilic characteristic and the repellency characteristic) of the surface of each pixel forming region in which the liquid material including the organic material is applied, the surface of the partition wall provided between each display pixels (pixel forming region) and the solvent component of the liquid material (embrocation).

Therefore, when the organic EL device operates so as to emit light, deterioration of the organic EL layer (organic EL device) is significant due to the light emission drive current concentrates to flow in the area where the film thickness of the organic EL layer is thin, and there are problems that the reliability of the display panel and the life span of the device are reduced, the desired brightness cannot be obtained because the voltage at the start of light emission is changed (shifted) from the designed value, and the display image quality of the display panel is degraded.

SUMMARY OF THE INVENTION

In view of the above problem, an advantage of the present invention is to provide a manufacturing method of a display apparatus which comprises a display panel in which a light emission function layer (organic EL layer) having an approximately even film thickness across the entire region of the forming region of each display pixel.

In order to obtain the above advantage, according to a first aspect of the present invention, a manufacturing method of a display apparatus which comprises a plurality of display pixels including light emitting elements having a carrier transport layer comprises first causing a surface of an electrode formed in a forming region of the plurality of display pixels by being enclosed by a partition wall which is provided on a substrate to have a lyophilic characteristic, making a surface of the partition wall have a repellency characteristic and second causing the surface of the electrode to have the lyophilic characteristic again by carrying out a plasma treatment in an inert gas atmosphere.

Preferably, in the first causing, the surface of the electrode is caused to have the lyophilic characteristic to an organic solution including a carrier transporting material by carrying out an oxygen plasma treatment or an UV ozone treatment to the surface of the electrode.

Preferably, in the making, the surface of the partition wall is made to have the repellency characteristic to an organic solution including a carrier transporting material by carrying out a plasma treatment to the partition wall in a fluorocarbon gas atmosphere.

Preferably, in the second causing, the surface of the electrode is made to have the lyophilic characteristic to an organic solution including a carrier transporting material by carrying out the plasma treatment in a nitrogen gas atmosphere or in an argon gas atmosphere.

Preferably, the partition wall includes a polyimide resin material or an acrylic resin material having a photosensitive property.

Preferably, the partition wall is formed on an insulation film including a silicon nitride film or a silicon oxide film formed on the substrate between the forming regions of the display pixels.

Preferably, the forming region of the display pixels is defined by the partition wall.

Preferably, the manufacturing method of the display apparatus further comprises forming the carrier transport layer by applying an organic solution including a carrier transporting material on the electrode which is caused to have the lyophilic characteristic again and drying the organic solution and forming a counter electrode which opposes the electrode of the plurality of display pixels via the carrier transport layer and which is formed so as to extend on the partition wall which is made to have the repellency characteristic.

Preferably, the carrier transport layer is constituted with a plurality of layers. In such case, the carrier transporting layers which are different from one another su as the hole transport layer and the electron transport layer may be used.

According to the manufacturing method of the display apparatus, a display panel in which the light emission function layer (organic EL layer; carrier transport layer) having an approximately even film thickness across the entire area of the forming region of each display pixel can be realized.

BRIEF DESCRIPTION OF THE DRAWINGS

The present invention will become more fully understood from the detailed description given hereinafter and the accompanying drawings given by way of illustration only, and thus are not intended as a definition of the limits of the present invention, and wherein:

FIG. 5A is a process cross-sectional view showing an embodiment of a manufacturing method of the display apparatus (display panel);

FIG. 5B is a process cross-sectional view showing an embodiment of a manufacturing method of the display apparatus (display panel);

FIG. 5C is a process cross-sectional view showing an embodiment of a manufacturing method of the display apparatus (display panel);

FIG. 5D is a process cross-sectional view showing an embodiment of a manufacturing method of the display apparatus (display panel);

FIG. 6A is a process cross-sectional view showing an embodiment of a manufacturing method of the display apparatus (display panel);

FIG. 6B is a process cross-sectional view showing an embodiment of a manufacturing method of the display apparatus (display panel);

FIG. 6C is a process cross-sectional view showing an embodiment of a manufacturing method of the display apparatus (display panel);

FIG. 7A is a process cross-sectional view showing an embodiment of a manufacturing method of the display apparatus (display panel);

FIG. 7B is a process cross-sectional view showing an embodiment of a manufacturing method of the display apparatus (display panel);

DESCRIPTION OF THE PREFERRED EMBODIMENT

Hereinafter, a manufacturing method of a display apparatus according to an embodiment of the present invention will be described in detail. Here, in the embodiment which is described hereinafter, a case where an organic EL device which is provided with an organic EL layer formed by an organic material being applied is used as a light emitting element which constitutes a display pixel will be described.

(Display Panel)

First, the display panel (organic EL panel) and the display pixel which are used in the display apparatus of the embodiment of the present invention will be described.

Figure 1:
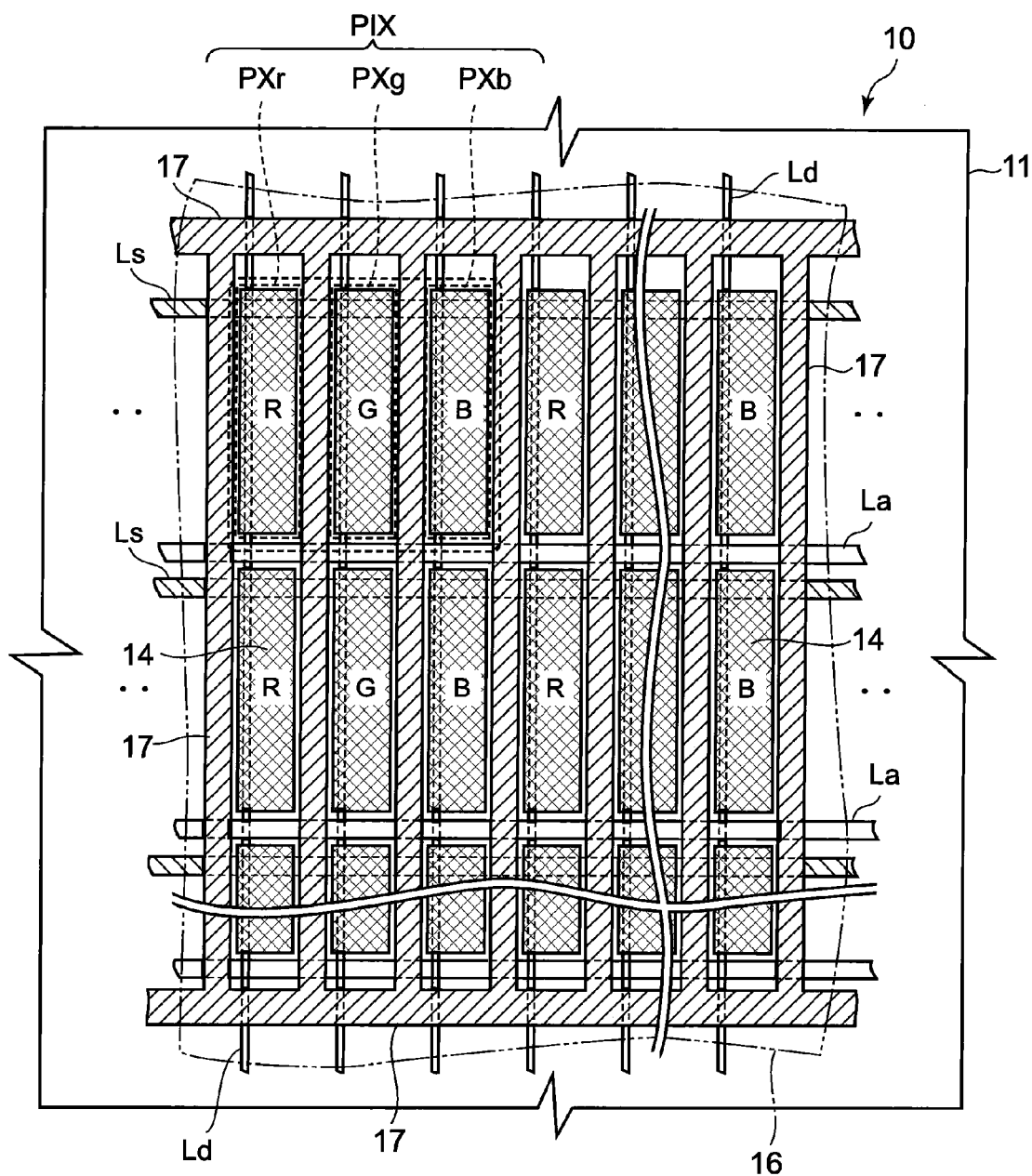
FIG. 1 is a schematic plan view showing an example of a pixel arrangement of a display panel which is used in a display apparatus of an embodiment in which the present invention is applied.
Figure 2:
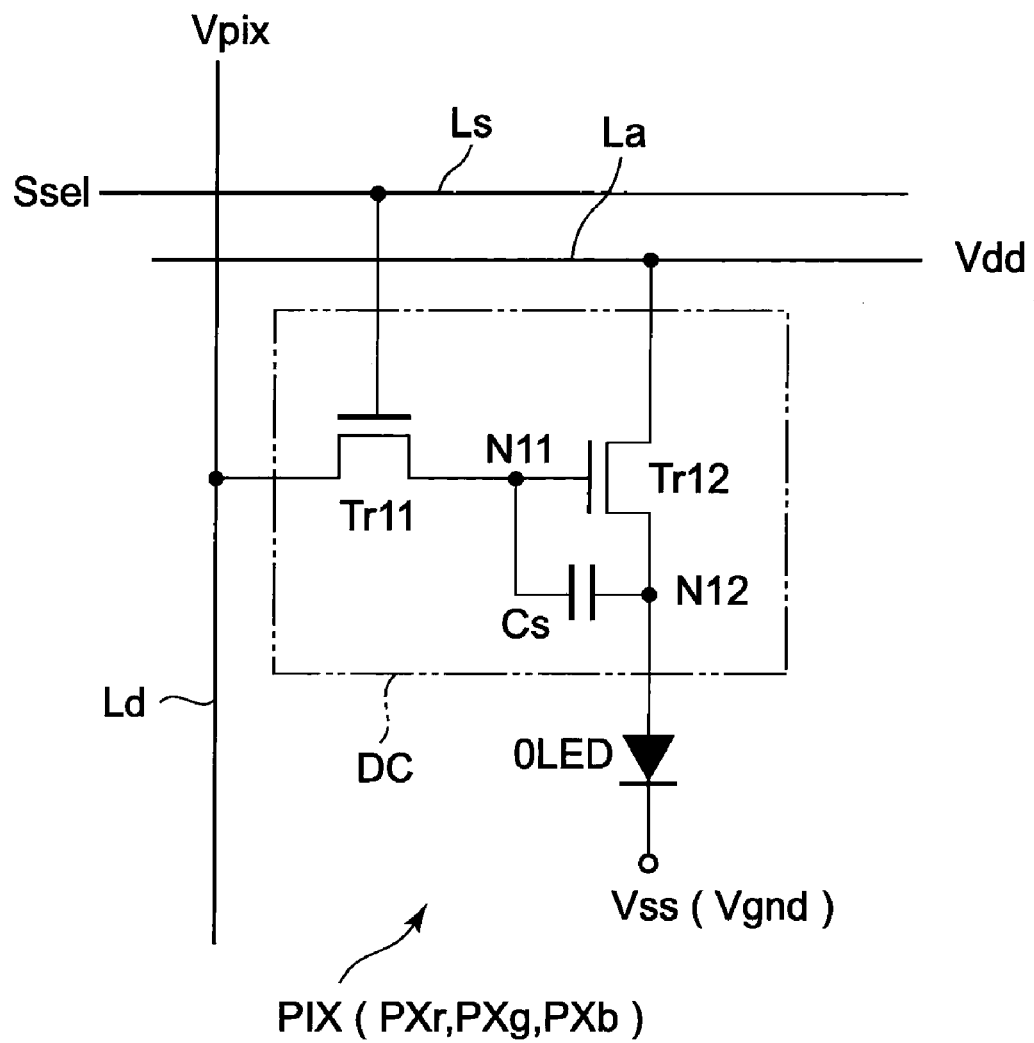
FIG. 2 is an analogous circuit diagram showing an example of a circuit structure of each display pixel (a light emitting element and a pixel drive circuit) which is two-dimensionally arranged in the display panel of the display apparatus of the embodiment in which the present invention is applied.

FIG. 1 is a schematic plan view showing an example of a pixel arrangement of the display panel which is used in the display apparatus of the embodiment in which the present invention is applied, and FIG. 2 is an analogous circuit diagram showing an example of a circuit structure of each display pixel (a light emitting element and a pixel drive circuit) which is two-dimensionally arranged in the display panel of the display apparatus of the embodiment of the present invention. Here, for the convenience of description, only a relation between a disposition of each pixel electrodes which is provided at each display pixel (sub pixel of each color; hereinafter, conveniently denoted as "color pixel") and an arrangement structure of each wiring layers and a dispositional relation between each pixel electrodes and a bank (partition wall) which defines a forming region of each display pixel seen from one side (viewing side; a side in which the organic EL devices are formed) of the display panel (insulative substrate) are shown in the plan diagram shown in FIG. 1. The transistors and the like within the pixel drive circuit shown in FIG. 2 which are provided at each display pixel to drive the organic EL device (light emitting element) of each display pixel so as to emit light are omitted from the drawing. Further, in FIG. 1, hatchings are conveniently used so as to clearly show the dispositions of the pixel electrodes, each wiring layers and the bank.

As shown in FIG. 1, in the display apparatus (display panel) according to the embodiment of the present invention, a plurality of groups of color pixels are repeatedly arranged in a row direction (left-right direction in the drawing) in one side of the insulative substrate 11 which is a glass substrate or the like. Each group of color pixels is constituted with each color pixel (sub pixel of each color) PXr, PXg and PXb respectively having each of the three colors red (R), green (G) and blue (B). Further, a plurality of each color pixel PXr, PXg and PXb in same color are respectively arranged in a line direction (top-down direction in the drawing). Here, one display pixel PIX is formed by grouping the adjacent color pixels PXr, PXg and PXb respectively corresponding o each of the three colors RGB as one group.

As shown in FIG. 1, regarding the display panel 10, the pixel forming region (each color pixel region) for the color pixel PXr, PXg or PXb in which a plurality of the color pixels of same color are respectively arranged in the line direction is defines by the bank (partition wall) 17 which is continuously disposed by having a plan patter in a palisaded shape or a lattice shape so as to protrude in one side of the insulative substrate 11. Further, the pixel electrode (for example, an anode electrode) 14 is formed in the pixel forming region of each color pixel PXr, PXg or PXb, and also the data line (signal line) Ld is disposed in the line direction (top-down direction in the drawing) so as to be parallel to the disposition direction of the bank 17. Furthermore, the select line Ls and the supply voltage line (for example, an anode line) La are disposed in the row direction (left-right direction in the drawing) which is orthogonal to the data line Ld so as to be parallel to one another. Moreover, although the detail description will be given afterwards, the counter electrode (for example, a cathode electrode) 16 which is constituted with a single electrode layer (solid electrode) is formed in the display panel 10 so as to commonly oppose to each electrodes 14 of a plurality of display pixels PIX which are two-dimensionally arranged on the insulative substrate 11.

As shown in FIG. 2, each color pixel PXr, PXg and PXb of the display pixel PIX has a circuit structure which comprises the pixel drive circuit (or a pixel circuit) DC having one or a plurality of transistors (for example, the amorphous silicon thin film transistor or the like) on the insulative substrate 11 and the organic EL device (light emitting device) which operates so as to emit light by the light emission drive current controlled by the pixel drive circuit DC being provided to the pixel electrode 14.

Particularly, for example, the pixel drive circuit DC comprises the transistor (select transistor) Tr11 in which the gate terminal is connected to the select line Ls, the drain terminal is connected to the data line Ld disposed in the line direction of the display panel 10, and the source terminal is connected to the connection point N11, the transistor (light emission drive transistor) Tr12 in which the gate terminal is connected to the connection point N11, the drain terminal is connected to the supply voltage line La, and the source terminal is connected to the connection point N12 and the capacitor Cs which is connected between the gate terminal of the transistor Tr12 and the source terminal as shown in FIG. 2.

Here, the n-channel type thin film transistor (the field effect transistor) is used for both transistors Tr11 and Tr12. When the transistors Tr11 and Tr12 are the p-channel type, the electrical relation of the source terminal and the drain terminal will be the opposite of one another. Further, the capacitor Cs is a capacitance component constituted with a parasitic capacitance formed between the gate terminal and the source terminal of the transistor Tr12 or a supportive capacitance additionally provided between the gate terminal and the source terminal of the transistor Tr12, or the capacitor Cs is a capacitance component constituted with both the parasitic capacitance and the supportive capacitance.

Moreover, regarding the organic EL device OLED, the anode terminal (the pixel electrode 14 which is to be the anode electrode) is connected to the connection point N12 of the pixel drive circuit DC, and the cathode terminal (cathode electrode) is integrally formed with the counter electrode 16 which is formed with a single electrode layer. For example, the counter electrode 16 is directly or indirectly connected to a predetermined low voltage power source to commonly apply a predetermined low voltage (the standard voltage Vss; for example, ground potential Vgnd) to all of the display pixels PIX (the cathode electrode of the organic EL device OLED) which are two-dimensionally arranged on the insulative substrate 11.

Here, in the display pixel PIX (the pixel drive circuit DC and the organic EL device OLED) shown in FIG. 2, the select line Ls is connected to the select driver (omitted from the drawing) to apply the select voltage Ssel for setting a plurality of display pixels PIX (the color pixels PXr, PXg and PXb) which are arranged in the row direction of the display panel 10 to the select condition at a predetermined timing. Further, the data line Ld is connected to the data driver (omitted from the drawing) to apply the tone signal (data voltage) Vpix according to the display data at a timing so as to synchronize to the select condition of the above display pixels PIX.

Moreover, for example, the supply voltage line La is directly or indirectly connected to a predetermined high voltage power source to apply a predetermined high voltage (supply voltage Vdd) in which the potential is higher than the standard voltage Vss to be applied to the counter electrode 16 of the organic EL device OLED in order to pass the light emission drive current according to the display data to the pixel electrodes (for example, anode electrodes) 14 of the organic EL drive OLED provided at each display pixel PIX (the color pixel PXr, PXg and PXb).

That is, in each display pixel PIX, the organic EL device OLED is made to be in a condition where the organic EL device OLED can emit light by giving the forward bias to the organic EL device by applying the supply voltage Vdd and the standard voltage Vss to both ends (the drain terminal of the transistor Tr12 and the cathode terminal of the organic EL device OLED) of a pair of the transistor Tr12 and the organic EL device OLED which are serially connected. Further, the current value of the light emission drive current which flows according to the tone signal Vpix is controlled by the pixel drive circuit DC.

In the drive control operation in the display pixel PIX having the above described circuit structure, first, the transistor Tr11 operates so as to be turned on to be set to the select condition by applying the select voltage Ssel of the select level (on level; for example, high level) to the select line Ls from the select driver (omitted from the drawing) in a predetermined select period. The pixel drive circuit DC is controlled so as to apply the tone signal Vpix having the voltage value according to the display data to the data line Ld from the data driver (omitted from the drawing) so as to synchronize to the above timing of the setting of the transistor Tr11 to the select condition. Thereby, the potential according to the tone signal Vpix is applied to the connection point N11 (that is, the gate terminal of the transistor Tr12) through the transistor Tr11.

In the pixel drive circuit DC having the circuit structure shown in FIG. 2, the current value of the current between the drain terminal and the source terminal of the transistor Tr12 is determined by the potential difference between the drain terminal and the source terminal and the potential difference between the gate terminal and the source terminal. Here, the supply voltage Vdd which is to be applied to the drain terminal (drain electrode) of the transistor Tr12 and the standard voltage Vss which is to be applied to the cathode terminal (cathode electrode) of the organic EL device OLED are fixed values. Therefore, the potential difference between the drain terminal and the source terminal of the transistor Tr12 is fixed in advance by the supply voltage Vdd and the standard voltage Vss. Further, the potential difference between the gate terminal and the source terminal of the transistor Tr12 is primarily determined by the potential of the tone signal Vpix. Therefore, the current value of the current which flows between the drain terminal and the source terminal of the transistor Tr12 can be controlled by the tone signal Vpix.

In such way, the transistor Tr12 operates so as to be turned on in a conductive condition (that is, a conductive condition according to the tone signal Vpix) according to the potential of the connection point N11 and the light emission drive current having a predetermined current value is passed into the standard voltage Vss (ground potential Vgnd) in the low voltage side from the supply voltage Vdd in the high voltage side through the transistor Tr12 and the organic EL device OLED by the transistor. Therefore, the organic EL device OLED operates so as to emit light at a brightness tone according to the tone signal Vpix (that is, the display data). Further, at this time, the electric charge is accumulated (charged) to the capacitor Cs between the gate terminal and the source terminal of the transistor Tr12 based on the tone signal Vpix applied to the connection point N11.

Subsequently, in the non-select period after the above select period is finished, the transistor Tr11 of the display pixel PIX operates so as to be turned off to be set in a non-select condition by applying the select voltage Ssel of the non-select level (off level; for example, low level) to the select line Ls, and the data line Ld and the pixel drive circuit DC are electrically cut off. At this time, the voltage equivalent to the tone signal Vpix is retained at the gate terminal of the transistor Tr12 (that is, the potential difference between the gate terminal and the source terminal is retained) by the accumulated electric charge being retained at the capacitor Cs.

Thus, similarly to the light emitting operation in the above select condition, a predetermined light emission drive current flows to the organic EL device OLED from the supply voltage Vdd through the transistor Tr 12 to continue the light emitting operation condition. For example, the light emitting operation condition is controlled so as to continue during the 1-frame period until the next tone signal Vpix is applied (written). Then, the image display operation to display the desired image information can be executed by, for example, orderly executing the above described drive control operation for each row for all of the display pixels PIX (each color pixel PXr, PXg and PXb) which are two-dimensionally arranged in the display panel 10.

Here, in FIG. 2, the tone control type circuit structure of the voltage specification type which makes the organic EL device OLED operate so as to emit light at a desired brightness tone by controlling the current value of the light emission drive current which is made to flow into the organic EL device OLED by adjusting (specifying) the voltage value of the tone signal Vpix to be written in each display pixel PIX (particularly, the gate terminal of the transistor Tr12 of the pixel drive circuit DC; the connection point N11) according to the display data is shown as the pixel drive circuit DC provided in the display pixel PIX. However, the pixel drive circuit DC may have the tone control type circuit structure of the current specification type which makes the organic EL device operate so as to emit light at a desired brightness tone by controlling the current value of the light emission drive current which is made to flow into the organic EL device OLED by adjusting (specifying) the current value to be written in each display pixel PIX according to the display data.

(Device Structure of the Display Pixel)

Next, a particular device structure (a plan layout and a cross-sectional structure) of the display pixel (the light emission drive circuit and the organic EL device) having the above described circuit structure will be described. Here, the display panel (organic EL panel) having a bottom emission type light emitting structure which emits the light which is emitted in the organic EL layer to the viewing side (the other side of the insulative substrate) through the insulative substrate will be shown.

Figure 3:
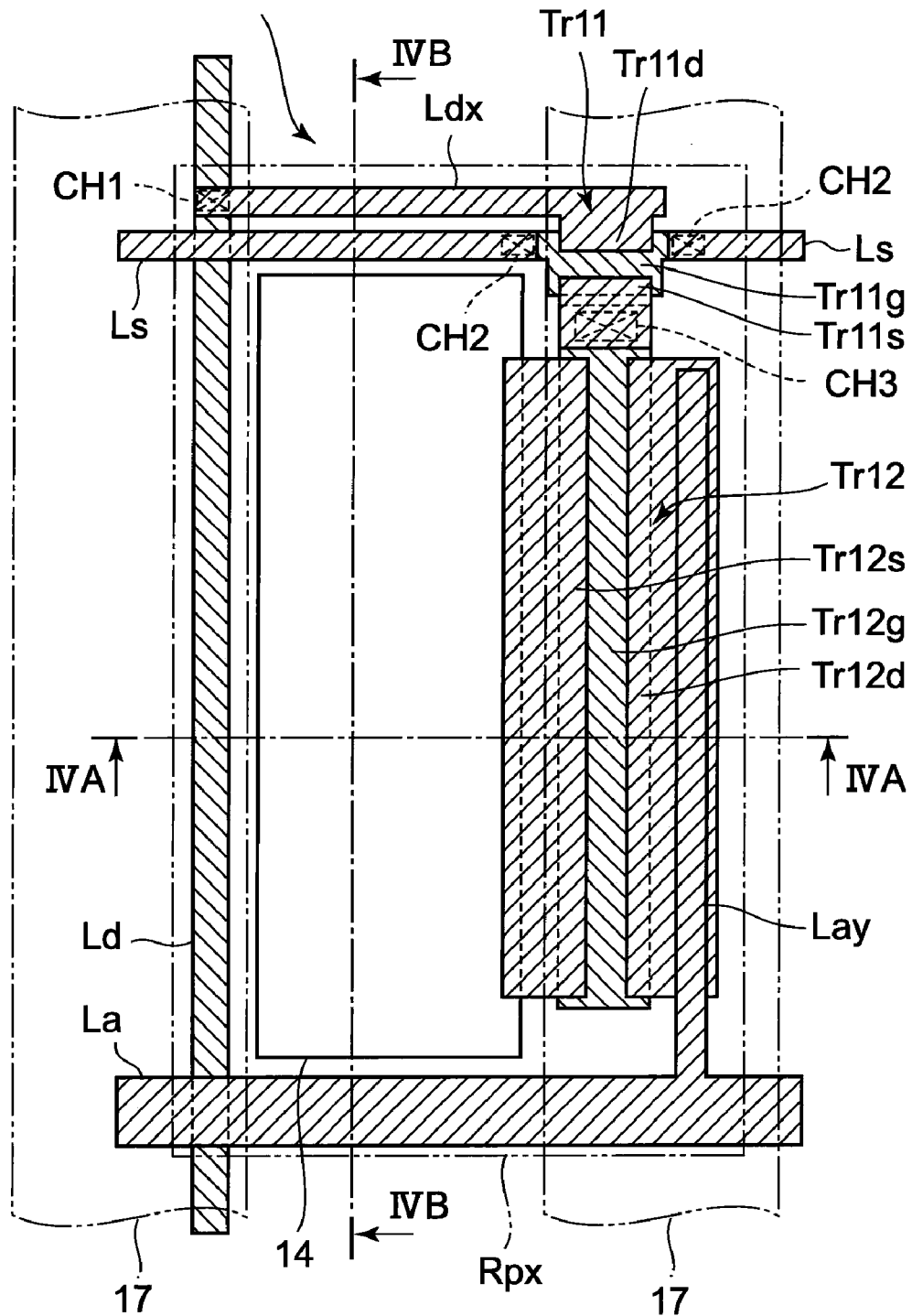
FIG. 3 is a plan layout view showing an example of a display pixel which can be used in the display apparatus (display panel) of the embodiment in which the present invention is applied.
Figure 4A:
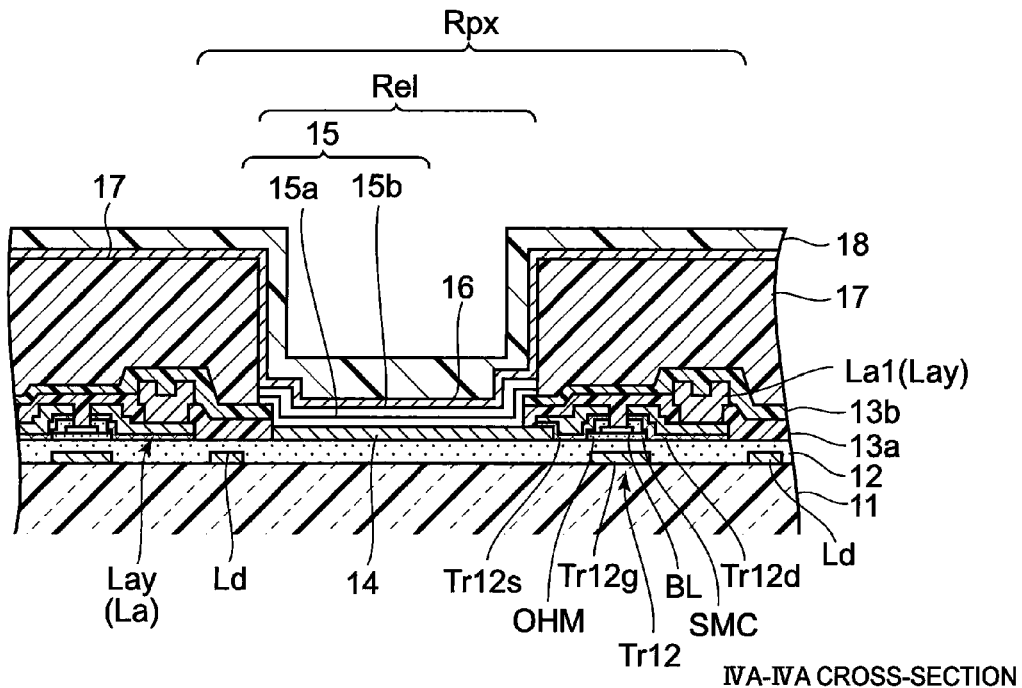
FIG. 4A is a schematic cross-sectional view of the display pixel of the display apparatus of the embodiment in which the present invention is applied.

FIG. 3 is a plan layout view showing an example of a display pixel which can be used in the display apparatus (display panel) of the embodiment of the present invention. Here, a plan layout of a specific one color pixel among each color pixel PXr, PXg and PXb of red (R), green (G) and blue (B) of the display pixel PIX shown in FIG. 1 is shown. Here, in FIG. 3, the layer in which each transistor, the wirings and the like of the pixel drive circuit DC shown in FIG. 2 are formed is mainly shown. Further, FIG. 4A is a schematic cross-sectional view cut along the line IVA-IVA (in the present specification, "IV" is conveniently used as a symbol corresponding to the roman numeral "4" shown in FIG. 3. The same is applies throughout the specification) in the display pixel having a plan layout shown in FIG. 3, and FIG. 4B is a schematic cross-sectional view cut along the line IVB-IVB in the display pixel having a plan layout shown in FIG. 3.

Particularly, regarding the display pixel PIX (the color pixels PXr, PXg, and PXb) shown in FIG. 2, for example, the select line Ls and the supply voltage line La are respectively disposed so as to extend in the row direction (left-right direction in the drawing) at the edge region in the upper side and the lower side of the pixel forming region Rpx as shown in FIG. 3 in the pixel forming region (the region including the organic EL device OLED forming region (EL device forming region) Rel in each color pixel PXr, PXg and PXb and the forming region of the bank 17 between each color pixel PXr, PXg and PXb) Rpx set in one side of the insulative substrate 11. Also, the data line Ld is disposed so as to extend in the line direction (top-down direction in the drawing) at the edge region in the left side of the above plan layout, the data line Ld being disposed so as to be orthogonal to the lines Ls and La. Further, the bank (described in detail afterwards) 17 is disposed so as to extend in the line direction by crossing over the color pixel which is adjacent in the right side at the edge region in the right side of the above mentioned pixel forming region Rpx.

Figure 4B:
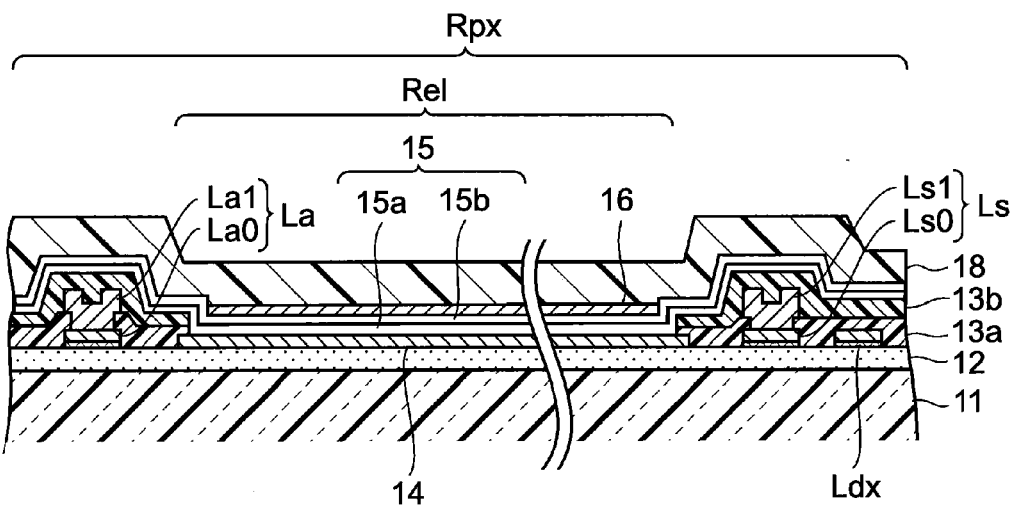
FIG. 4B is a schematic cross-sectional view of the display pixel of the display apparatus of the embodiment in which the present invention is applied.

Here, for example, the data line Ld is provided more in the lower layer side (the insulative substrate 11 side) than the select line Ls and the supply voltage line La and is formed by the same process as forming the gate electrode by patterning the gate metal layer for forming the gate electrode Tr11g, Tr12g of the transistor Tr11, Tr12, respectively, and the data line Ld is connected to the drain electrode Tr11d of the transistor Tr11 which is integrally formed with the signal wiring layer Ldx through the contact hole CH1 provided in the gate insulation film 12 formed on the data line Ld as shown in FIGS. 3, 4A and 4B.

Moreover, the select line Ls is provided more in the upper layer side than the data line Ld and is formed by the same process as forming the source electrodes and the drain electrodes by patterning the source/drain metal layer for forming the source electrode Tr11s, Tr12s and the drain electrode Tr11d, Tr12d of the transistor Tr11, Tr12, respectively, and the select line Ls is connected to the gate electrode Tr11g through the contact holes CH2 which are provided in the gate insulation film 12 and which are positioned at both ends of the gate electrode Tr11g of the transistor Tr11.

Here, for example, the select line Ls has a wiring structure in which the lower layer wiring section Ls0 and the upper layer wiring section Ls1 are layered in a stacking manner. Further, the supply voltage line La (including the after mentioned power supply wiring layer Lay) also has a wiring structure in which the lower layer wiring section La0 and the upper layer wiring section La1 are layered in a stacking manner. Both the lower layer wiring sections Ls0, La0 are provided on the same layer with the source electrode Tr12s and the drain electrode Tr12d of the transistor Tr12, or are formed integrally with the source electrode Tr12s and the drain electrode Tr12d of the transistor Tr12. Further, the lower wiring sections Ls0, La0 are both formed by the same process of patterning the source/drain metal layer for forming the source electrode Tr12s and the drain electrode Tr12d.

Here, each of the lower layer wiring section Ls0, La0 has a layering structure of the transition metal layer such as chromium (Cr), titanium (Ti) or the like for reducing the migration and the low resistance metal layer such as simple aluminum, aluminum alloy or the like for reducing the wiring resistance provided on the transition metal layer. The upper layer wiring sections Ls1 and La1 may be formed with a single layer of the low resistance metal layer such as simple aluminum, aluminum alloy or the like for reducing the wiring resistance. However, it is preferred that the upper layer wiring sections Ls1, La1 have the layering structure in which the low resistance metal layer is provided on the transition metal layer such as chromium (Cr), titanium (Ti) or the like for reducing the migration.

More particularly, for example, the transistor Tr11 shown in FIG. 2 is disposed so as to extend along the select line Ls (or the signal wiring layer Ldx which is formed in the row direction and which is connected to the data line Ld) which is disposed in the row direction in the pixel drive circuit DC, and the transistor Tr12 is disposed so as to extend along the power supply wiring layer Lay (or the bank 17) formed so as to protrude in the line direction from the supply voltage line La in the pixel drive circuit DC as shown in FIG. 3.

Here, each transistor Tr11 and Tr12 has a structure of the known field effect thin film transistor, and each transistor Tr11, Tr12 comprises the gate electrode Tr11g, Tr12g, the semiconductor layer SMC formed in the region which corresponds to each of the gate electrode Tr11g, Tr12g via the gate insulation film 12, the source electrode Tr11s, Tr12s formed at both ends of the semiconductor layer SMC so as to extend and the drain electrode Tr11d, Tr12d, respectively.

Here, a channel protection layer BL such as oxide silicon, nitride silicon or the like for preventing the etching damage to occur on the semiconductor layer SMC is formed on the semiconductor layer SMC on which the source electrode Tr11s, Tr12s and the drain electrode Tr11d, Tr12d of each transistor Tr11, Tr12 are respectively formed so as to oppose to one another. Further, the impurity layer OHM for realizing the ohmic connection between the semiconductor layer SMC and the source electrode Tr11s, Tr12s, respectively, and between the semiconductor layer SMC and the drain electrode Tr11d, Tr12d, respectively, is formed between the source electrode Tr11s, Tr12s and the semiconductor layer SMC, respectively, and between the drain electrode Tr11d, Tr12d and the semiconductor layer SMC, respectively.

Regarding the transistor Tr11, the gate electrode Tr11g is connected to the select line Ls via a pair of contact holes CH2 provided in the gate insulation film 12 and the draing electrode Tr11d is integrally formed with the signal wiring layer Ldx as shown in FIG. 3 so as to correspond to the circuit structure of the pixel drive circuit DC shown in FIG. 2.

Moreover, regarding the transistor Tr12, the gate electrode Tr12g is connected to the source electrode Tr11s of the above transistor Tr11 via the contact hole CH3 provided in the gate insulation film 12, the drain electrode Tr12d is connected to the power supply wiring layer Lay which is integrally formed with the supply voltage line La, and the source electrode Tr12s is directly connected to the pixel electrode 14 of the organic EL device OLED as shown in FIGS. 3, 4A and 4B.

As shown in FIGS. 3, 4A and 4B, the organic EL device OLED is provided on the gate insulation film 12 of the transistors Tr11, Tr12 and is directly connected to the source electrode Tr12s of the transistor Tr12. Further, the pixel electrode (for example, the anode electrode) 14 in which a predetermined light emission drive current is supplied, the organic EL layer (light emitting function layer) 15 including the hole transport layer 15a (carrier transport layer) formed in the EL device forming region Rel (corresponding to the applying region of the after mentioned organic compound containing liquid) which is defined (set between the bank 17) by the bank 17 disposed in the line direction on the insulative substrate 11 and the electron transporting light emission layer 15b (carrier transport layer) and the counter electrode 16 constituted with a single electrode layer (solid electrode) commonly provided in each display pixel PIX which is two-dimensionally arranged on the insulative substrate 11 are orderly layered in a stacking manner in the organic EL device OLED.

Here, in the display panel 10 according to the embodiment, the pixel electrode 14 is formed with an electrode material having a light transmittance property (transparent) such as the ITO or the like, and the counter electrode 16 is formed with an electrode material having a light reflective property because the display panel 10 has the bottom emission type light emitting structure. The counter electrode 16 is also provided so as to extend on the bank 17 which defines the EL device forming region Rel and not only in the EL device forming region Rel of each display pixel PIX.

In the above described device structure, description is given for the case were the data line Ld is formed by patterning the gate metal layer, the select line Ls is formed by patterning the source/drain metal layer, and the data line Ld and the select line Ls are respectively connected to the drain electrode Tr11$d$ and the gate electrode Tr11$g$ of the transistor Tr11 via the contact holes CH1 and CH2. However, the device structure is not limited to this, an the data line Ld and the select line Ls may be integrally formed with the drain electrode Tr11$d$ and the gate electrode Tr11$g$ of the transistor Tr11 and not being connected via the contact holes CH1 and CH2 by the data line Ld being formed by patterning the source/drain metal layer and the select line Ls being formed by patterning the gate metal layer.

Moreover, a description is given for the case where the supply voltage line La and the power supply wiring layer Lay are formed as a different layer from the source/drain metal layer for forming the source electrode Tr12$s$ and the drain electrode Tr12$d$ of the transistor Tr12. However, the supply voltage line La and the power supply wiring layer Lay may be integrally formed with the drain electrode Tr12$d$ by patterning the source/drain metal layer. In such case, the supply voltage line La needs to be electrically insulated from other wirings which are formed by patterning the source/drain metal layer.

The bank 17 is the bordering region of a plurality of display pixels PIX (each color pixel PXr, PXg and PXb) which are two-dimensionally arranged in the display panel 10, and the bank 17 is disposed in the line direction of the display panel 10 (so as to have a plan patter in a palisaded shape or a lattice shape as shown in FIG. 1 in the entire display panel 10). Here, as shown in FIGS. 3 and 4A, the transistor Tr12 is formed so as to extend in the line direction of the display panel 10 (insulative substrate 11) within the bordering region, the insulation films 13$a$ and 13$b$ which cover the transistor Tr12 and which realize the function as an interlayer insulator between the pixel electrodes 14 which are formed in each pixel forming region Rpx, and the bank 17 is formed on the insulation films 13$a$ and 13$b$ by layering the resin layers in a stacking manner so as to continuously protrude from the surface of the insulative substrate 11. In such way, the region enclosed by the bank 17 which extends in the line direction (the EL device forming region Rel of a plurality of display pixels PIX arranged in the line direction (up-down direction in the drawing; see FIG. 1)) is defined as the applying region of an organic compound material at the time of forming the organic EL layer 15 (the hole transport layer 15$a$ and the electron transporting light emission layer 15$b$).

Regarding the banks 17 applied in the embodiment, a surface treatment is carried out to at least the surface (side surfaces and upper surface) of the bank 17 so as to have repellency characteristic with respect to the organic compound containing liquid to be applied to the EL device forming region Rel. On the other hand, a surface treatment is carried out to the surface of the pixel electrode 14 of the organic EL device OLED so as to have a lyophilic characteristic with respect to the above organic compound containing liquid. Further, for example, the bank 17 is formed by using a photosensitive resin material.

Here, the one surface of the insulative substrate 11 in which the above described pixel drive circuit DC, organic EL device OLED (the pixel electrode 14, the organic EL layer 15 and the counter electrode 16) and bank 17 are formed is enclosed by attaching a metal cap, a sealing substrate (omitted from the drawing) or the like.

Regarding such display panel 10, in the pixel drive circuit DC including functional devices such as the transistors Tr11, Tr12 and the wiring layers such as the select line Ls, the data line Ld and the supply voltage line (anode line) La, the organic EL device OLED of each display pixel PIX (each color pixel PXr, PXg and PXb) operates so as to emit light in a desired brightness tone according to the display data by the light emission drive current having a predetermined current value being supplied to the pixel electrode 14 by flowing between the source terminal and the drain terminal of the transistor Tr12 based on the tone signal Vpix according to the display data supplied through the data line Ld.

At this time, because the display panel 10 shown in the embodiment, that is, the pixel electrode 14 has the light transmittance property and because the counter electrode 16 has the light reflective property (that is, because the organic EL device OLED is the bottom emission type), the light emitted in the organic EL layer 15 of each display pixel PIX (each color pixel PXr, PXg and PXb) is transmitted through the insulative substrate 11 directly via the pixel electrode 14 having the light transmittance property or by being reflected by the counter electrode 16 having the light reflective property to be emitted to the other side (lower side in the drawings of FIGS. 4A and 4B) of the insulative substrate 11 which is the viewing side.

(Manufacturing Method of the Display Apparatus)

Next, the manufacturing method of the display apparatus (display panel) according to the embodiment of the present invention will be described.

FIGS. 5A to 8B are process cross-sectional views showing an embodiment of the manufacturing method of the display apparatus (display panel) according to the embodiment of the present invention. Here, the cross-section cut along the line IVA-IVA and the cross-section cut along the line IVB-IVB of FIG. 3 shown in FIGS. 4A and 4B are shown by depicting the cross-section cut along the line IVA-IVA in the right side and the cross-section cut along the line IVB-IVB in the left side in FIGS. 5A to 8B.

In the manufacturing method of the above display apparatus (display panel), first, the transistors Tr11, Tr12, the data line Ld, the signal wiring layer Ldx and the wiring layers such as the lower layer wiring section Ls0 of the select line Ls and the lower layer wiring section La0 of the supply voltage line La of the above described pixel drive circuit (see FIGS. 2 and 3) DC and the pixel electrode 14 to be the anode electrode of the organic EL device OLED are formed for each of the pixel forming region Rpx of the display pixel PIX (each color pixel PXr, PXg and PXb) which is set on one side (upper side in the drawing) of the insulative substrate 11 such as a glass substrate as shown in FIGS. 5A to 5D.

Particularly, the gate electrodes Tr11$g$, Tr12$g$ and the data line Ld are simultaneously formed by patterning the gate metal layer as shown in FIG. 5A after the gate metal layer is formed on the transparent insulative substrate 11. Thereafter, the gate insulation film 12, the semiconductor film SMC' to be the semiconductor layer SMC including amorphous silicon and the like and the insulation film BL' such as nitride silicon or the like to be the channel protection layer BL are continuously formed by coating formation in the entire area of the insulative substrate 11.

Subsequently, as shown in FIG. 5B, the channel protection layer BL and the semiconductor layer SMC are orderly formed in the region corresponding to the gate electrodes Tr11g, Tr12g on the gate insulation film 12 by arbitrarily patterning the above mentioned insulation film BL' and the semiconductor film SMC'. Thereafter, the impurity layer OHM for the ohmic connection is formed at both ends of the semiconductor layer SMC.

Then, as shown in FIG. 5C, the pixel electrode 14 having a plan pattern in a rectangular shape and having a transparent electrode material (having the light transmittance property) such as tin doped indium oxide (Indium Tin Oxide; ITO), zinc doped indium oxide (Indium Zinc Oxide; IZO) or the like is formed in an approximate center region (the region in the plan layout shown in FIG. 3 except for the peripheral portion of the place where the transistors Tr11, Tr12 and various types of wirings are disposed) of the pixel forming region Rpx of each display pixel PIX on the gate insulation film 12. Thereafter, as shown in FIG. 3, the contact holes CH1, CH2 and CH3 are formed in the gate insulation film 12 so that the upper surface of the predetermined position of the data line Ld, the gate electrodes Tr11g, Tr12g of the transistors Tr11, Tr12 are exposed.

As shown in FIG. 5D, the source electrodes Tr11s, Tr12s and the drain electrodes Tr11d, Tr12d are formed at both ends of the semiconductor layer SMC of the transistors Tr11, Tr12 so as to extend via the impurity layer OHM, and the lower layer wiring section Ls0 of the select line Ls, the lower layer wiring section La0 of the supply voltage line La (including the power supply wiring layer Lay) and the signal wiring layer Ldx are simultaneously formed.

Here, the source electrodes Tr11s, Tr12s, the drain electrodes Tr11d, Tr12d, the lower layer wiring section Ls0 of the select line Ls, the lower layer wiring section La0 of the supply voltage line La and the signal wiring layer Ldx are collectively formed by patterning the source/drain metal layer after forming the source/drain metal layer after the process of FIG. 5C. In such way, the signal wiring layer Ldx is connected to the data line Ld which positions at the lower side via the contact hole CH1, the select line Ls is connected to the gate electrode Tr11g which positions at the lower side via the contact hole CH2, and the source electrode Tr11s is connected to the gate electrode Tr12g which positions at the lower side via the contact hole CH3. Further, the other end side of the source electrode Tr12s of the transistor Tr12 extends onto the pixel electrode 14 to be electrically connected.

Moreover, at least the source/drain metal layer for forming the source electrode Tr11s and the drain electrode Tr11d of the above transistor Tr11, the source electrode Tr12s and the drain electrode Tr12d of the transistor Tr12, the lower layer wiring section Ls0 of the select line Ls, the lower layer wiring section La0 of the supply voltage line La (including the power supply wiring layer Lay) and the signal wiring layer Ldx has a wiring structure in which the metal layer in the lower layer side including simple chromium (Cr), chromium alloy or the like and the metal layer in the upper layer side including simple aluminum (Al) or aluminum alloy such as aluminum-titanium (AlTi), aluminum-neodymium-titanium (AlNdTi) or the like are layered in a stacking manner.

Next, the insulation film including an inorganic insulative material such as nitride silicon ($Si_3N_4$, SiNx), oxide silicon ($SiO_2$) or the like is formed so as to cover the entire area in one side of the insulative substrate 11 including the transistors Tr11, Tr12 and the lower layer wiring section Ls0, La0 of the select line Ls and the supply voltage line La. Thereafter, as shown in FIG. 6A, the insulation film 13a having openings where the upper surface of the drain electrode Tr12d of the transistor Tr12, the upper surface of the lower layer wiring section Ls0 of the select line Ls and the lower layer wiring section La0 of the supply voltage line La and the upper surface of the pixel electrode 14 are to be exposed are formed by patterning the insulation film.

Subsequently, the low resistance metal layer (aluminum thin film) for reducing the wiring resistance such as simple aluminum (Al) or aluminum alloy such as aluminum-titanium (AlTi), aluminum-neodymium-titanium (AlNdTi) or the like is formed on the insulative substrate 11 in which the insulation film 13a is formed by the spattering method, the ion plating method, the vacuum deposition method, the plating method or the like. Thereafter, as shown in FIG. 6B, the upper layer wiring sections Ls1, La1 including an aluminum thin film are formed in the region corresponding to the plan pattern of the select line Ls and the supply voltage line La (including the power supply wiring layer Lay) by patterning the low resistance metal layer, and the select line Ls and the supply voltage line La (including the power supply wiring layer Lay) having the layered wiring structure including the upper layer wiring sections Ls1, La1 and the lower layer wiring sections Ls0, La0 are formed.

Then, for example, the insulation film including nitride silicon, oxide silicon or the like is formed by using the chemical vapor deposition (CVD method) or the like so as to cover the entire area of one side of the inculative substrate 11 including the select line Ls and the supply voltage line La. Thereafter, as shown in FIG. 6C, the insulation film 13b which covers the transistors Tr11, Tr12, the select line Ls and the supply voltage line La (including the power supply wiring layer Lay) and which has opening for the upper surface of the pixel electrode 14 of each display pixel PIX to expose is formed by patterning the insulation film.

Then, as shown in FIG. 7A, for example, the bank 17 including the photosensitive resin material such as polyimide system, acrylic or the like is formed on the insulation film 13 formed in the borderline region between the adjacent display pixels PIX. Particularly, the bank (partition wall) 17 having a plan patter (see FIG. 1) in a palisaded shape or a lattice shape which includes the borderline region between the display pixels PIX adjacent in the row direction, which is the region extending in the line direction of the display panel 10, is formed by carrying out the light exposure and the developing process to the photosensitive resin layer formed by having a film thickness of 1 to 5 μm so as to cover the entire area on one side of the insulative substrate 11 including the insulation film 13b. Here, as for a resin material, a polyimide coating material "Photoneece PW-1030", "Photoneece DL-1000" or the like manufactured by TORAY Industries. Inc. can be applied preferably. In such way, the EL device forming region Rel (the forming region of the organic EL layer 15 of the organic EL device OLED) of a plurality of display pixel PIX of the same color which are arranged in the line direction of the display panel 10 is defined by being enclosed by the bank 17, and the upper surface of the pixel electrode 14 in which the outer edge is specified by the opening formed in the insulation films 13a, 13b is exposed (partition wall forming process).

Next, after the insulative substrate 11 is cleaned by pure water, the process (lyophilic process) to make the surface of the pixel electrode 14 which is exposed in each EL device forming region Rel defined by the bank 17 and the surface of the insulation films 13a, 13b have the lyophic characteristic with respect to the organic compound containing liquid of the hole transport material or the electron transporting light emission material which are used in the after mentioned carrier transport layer forming process is carried out by carrying out the oxygen plasma treatment, the UV ozone process or the like, for example. In the carrier transport layer forming process, the surface of the pixel electrode 14 and each sides of the insulation films 13a, 13b are the portions where contact with the organic compound containing liquid.

Then, for example, by carrying out the plasma treatment (fluorocarbon gas plasma treatment) in the fluorocarbon gas atmosphere to the insulative substrate 11, the surface of the bank 17 is made to have repellency characteristic with respect to the organic compound containing liquid (repellency process). Further, for example, by carrying of the plasma treatment (inert gas plasma treatment) in the inert gas atmosphere such as nitrogen gas, argon gas or the like, the surfaces of the pixel electrode 14 and the insulation films 13a, 13b in which the lyophilic characteristic is degraded in a small degree by the above repellency process are made to have the lyophilic characteristic again (re-lyophilic process). In such way, on the same insulative substrate 11, a condition in which only the surface of the bank 17 formed by a resin material has a high repellency characteristic and the surface of the pixel electrode 14 which is exposed in each EL device forming region Rel defined by the bank 17 have high lyophilic characteristic is realized. The particular effect of the lyophilic process (including the re-lyophilic process) and the repellency process will be described in detail afterwards.

By defining the EL device forming region Rel of each display pixel PIX (organic EL device OLED) having high repellency characteristic by the bank 17, leakage and humping of the organic compound containing liquid into the EL device forming region Rel of the adjacent display pixel PIX can be prevented even when the light emission layer (electron transporting light emission layer 15b) of the organic EL layer 15 is formed by applying the organic compound containing liquid using the nozzle printing method or the inkjet method in the after mentioned carried transport layer forming process. Further, mixing of color of the adjacent pixels can be prevented and red, green and blue can be colored so as to be separated.

Moreover, by the surface of the bank 17 having high repellency characteristic and by the surfaces of the pixel electrode 14 which are exposed in each EL device forming region Rel having high lyophilic characteristic, rising of the organic compound containing liquid which is applied in the carrier transport layer forming process to the side of bank 17 can be prevented. Further, the organic EL layer 15 (each layer of the hole transport layer 15 a and the electron transporting light emission layer 15b) having an approximately even film thickness can be formed on the entire region of the pixel electrode 14 because the organic compound containing liquid is approximately evenly spread on the surface of the pixel electrode 14 so as to sufficiently blend.

Here, the "repellency characteristic" used in the embodiment is a condition where the contact angle is about 50° or greater when the contact angle is measured by dropping an organic compound containing liquid including the hole transport material to be the after mentioned hole transport layer, an organic compound containing liquid including the electron transporting light emission material to be the electron transporting light emission layer or an organic solvent used for the solution of the above organic compound containing liquids on the insulative substrate or the like. Further, the "lyophilic characteristic" in contrary to the "repellency characteristic" is the condition where the above contact angle is about 40° or smaller, preferably 10° or smaller in the embodiment.

Subsequently, as shown in FIG. 7B, the hole transport layer (carrier transport layer) 15a is formed by applying the solution or the dispersion liquid of the hole transport material by the same process by using the nozzle printing (nozzle coating) method in which the continuous solution (liquid flow) is discharged, the inkjet method in which a plurality of non-continuous liquid drops which are separated from one another are discharged to a predetermined position or the like to the EL device forming region Rel (the forming region of the organic EL device OLED) of each color, and by heating and drying the solution or the dispersion liquid.

Particularly, the hole transport layer 15a which is the carrier transport layer is formed by fixing the hole transport material of organic polymer system on at least the pixel electrode 14 by removing residual solution by carrying out the drying process by heating the stage in which the insulative substrate 11 is mounted at the temperature condition of 100° C. or more after applying polyethylenedioxythiophene/polystyrenesulphonic acid aqueous solution (PEDOT/PSS; a dispersion liquid in which polyethylenedioxythiophene PEDOT which is the conductive polymer and polystyrenesulphonic acid PSS which is a dopant are dispersed in aqueous medium) on the pixel electrode 14 as the organic compound containing liquid including the hole transporting material (carrier transporting material) of organic polymer system, for example.

Here, the upper surface of the pixel electrode 14 which is exposed in and the surface of the insulation films 13a, 13b at the outer edge portion of the pixel electrode 14 have the lyophilic characteristic with respect to the organic compound containing liquid including the hole transporting material by the lyophilic process. Thus, the organic compound containing liquid applied to the EL device forming region Rel defined by the bank 17 spreads on the pixel electrode 14 and the insulation films 13a, 13b at the outer edge of the pixel electrode 14 so as to sufficiently blend. On the other hand, the bank 17 is formed so as to be sufficiently higher with respect to the height of the organic compound containing liquid (PEDOT/PSS) to be applied and has sufficient repellency characteristic with respect to the organic compound containing liquid. Therefore, the leakage or humping of the organic compound containing liquid into the EL device forming region Rel of the adjacent display pixel PIX can be prevented.

Figure 8A:
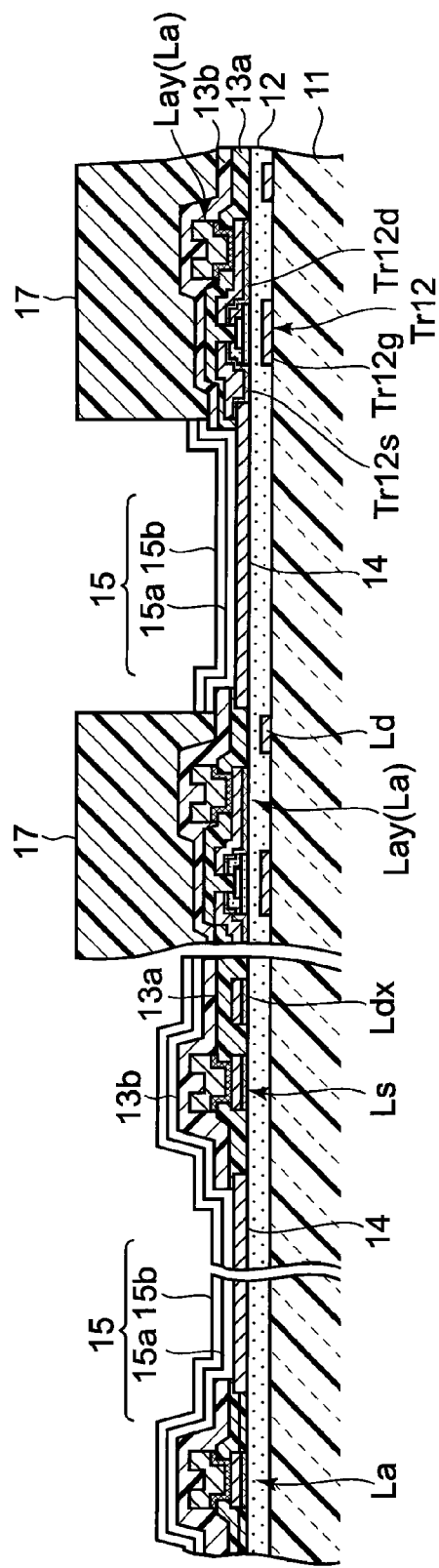
FIG. 8A is a process cross-sectional view showing an embodiment of a manufacturing method of the display apparatus (display panel)

Next, as shown in FIG. 8A, the electron transporting light emission layer (carrier transport layer) 15b is formed by applying the solution or the dispersion liquid of the electron transporting light emission material on the hole transport layer 15a by using the nozzle printing method, the inkjet method or the like to the EL device forming region Rel of each color, and by heating and drying the solution or the dispersion liquid.

Particularly, the electron transporting light emission layer 15b which is the carrier transport layer and also the light emission layer is formed by applying a solution of 0.1 wt % to 5 wt % in which a light emission material in red (R), green (G) and blue (B) including a conjugate double bond polymer or polyparaphenylene vinylene system, polyfluorene system or the like is arbitrarily dissolved or dispersed in aqueous medium or an organic solvent such as tetralin, tetramethylbenzene, mesitylene or xylene, for example, as the organic compound containing liquid including the electron transporting light emission material (carrier transporting material) of an organic polymer system on the hole transport layer 15a, and then by fixing the electron transporting light emission material of organic polymer system on the hole transport layer 15a by removing residual solution by carrying out the drying process by heating the stage in nitrogen atmosphere.

Here, the surface of the hole transport layer 15a formed in the EL device forming region Rel has the lyophilic characteristic with respect to the organic compound containing liquid including the electron transporting light emission material. Thus, the organic compound containing liquid which is applied to the EL device forming region Rel defined by the bank 17 is spread on the hole transport layer 15a so as to sufficiently blend. On the other hand, the bank 17 is set so as to be sufficiently high with respect to the height of the organic compound containing liquid to be applied and has sufficient repellency characteristic with respect to the organic compound containing liquid. Thus, leakage or humping of the organic compound containing liquid into the EL device forming region Rel of the adjacent display pixel PIX can be prevented.

In such way, the organic EL layer (light emission function layer) 15 is formed by orderly layering the hole transport layer 15a and the electron transporting light emission layer 15b on the pixel electrode 14 (carrier transport layer forming process).

Figure 8B:
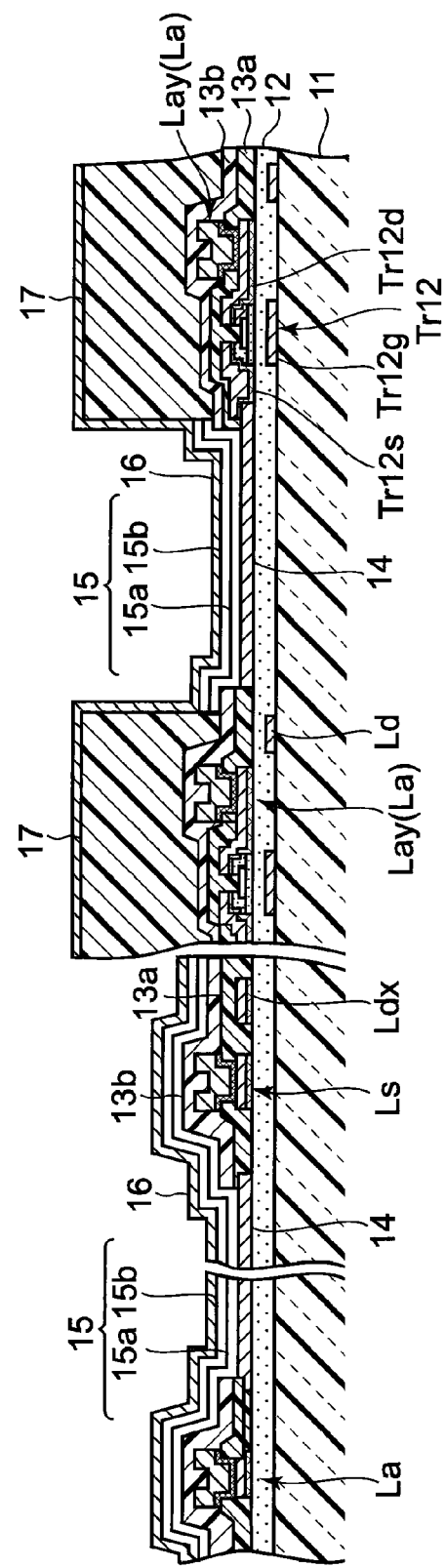
FIG. 8B is a process cross-sectional view showing an embodiment of a manufacturing method of the display apparatus (display panel)

Subsequently, as shown in FIG. 8B, a common counter electrode (for example, a cathode electrode) 16 which opposes to each pixel electrode 14 via the organic EL layer 15 of each EL device forming region Rel, the counter electrode 16 having a light reflecting characteristic, is formed on the insulative substrate 11 in which the bank 17 and the organic EL layer 15 (the hole transport layer 15a and the electron transporting light emission layer 15b) are formed.

Here, an electrode structure in which the electron injection layer (cathode electrode) of low work function such as calcium (Ca), barium (Ba), lithium (Li), indium (In) or the like in a thickness of 1 to 10 nm and a thin film (power supply electrode) of high work function including an alloy of such as aluminum (Al) system, chromium (Cr) system, silver (Ag) system and palladium-silver (AgPd) system of a thickness of 100 nm or more or a transparent electrode such as the ITO are orderly layered by using the vacuum deposition method or the spattering method, for example, can be applied to the counter electrode 16.

Moreover, as shown in FIGS. 1, 4A and 4B, the counter electrode 16 is not only formed in a region opposing to the pixel electrode 14 in each EL device forming region Rel (the forming region of the organic EL device OLED), but also the counter electrode 16 is formed as a single conductive layer (a solid electrode) which extends to the bank 17 which defines each EL device forming region Rel and to the insulation films 13a, 13b (counter electrode forming process).

Next, the display panel 10 in which a plurality of display pixel PIX (the organic EL device OLED and the pixel drive circuit DC) having a cross-sectional structure (bottom emission type light emitting structure) as shown in FIGS. 4A and 4B are arranged in a matrix form is completed by forming the sealing layer 18 including the silicon oxide film, the silicon nitride film or the like on the entire area of one side of the insulative substrate 11 by using the CVD method or the like after the counter electrode 16 is formed. Here, in addition to the sealing layer 18 or instead of the sealing layer 18, a metal cap (sealing lid) or a sealing substrate such as glass may be attached by using an UV curing adhesive or a heat curing adhesive.

In such way, in the manufacturing method of the display apparatus according to the embodiment, after the surfaces of the pixel electrode 14 which is exposed in the EL device forming region Rel and the insulation films 13a, 13b are made to have the lyophilic characteristic with respect to the organic compound containing liquid which is applied in the carrier transport layer forming process by carrying out the oxygen plasma treatment to the entire surface of the insulative substrate 11 in which the pixel electrode 14 and the bank 17 are formed, the surface of the bank 17 which defines the EL device forming region Rel is made to have the repellency characteristic with respect to the above organic compound containing liquid by the fluorocarbon plasma treatment and further the surfaces of the pixel electrode 14 and the insulation films 13a, 13b are made to have the lyophilic characteristic with respect to the organic compound containing liquid again by the nitrogen plasma treatment before the carrier transport layer forming process in which the organic EL layer 15 (for example, the hole transport layer 15a and the electron transporting light emission layer 15b) of the organic EL device OLED provided at each display pixel PIX is formed.

(Testing of Effect)

Next, the effect specific to the manufacturing method of the display apparatus having the above feature will be described in detail.

Here, in order to particularly show the superiority of the manufacturing method according to the embodiment, the comparison testing is carried out by showing the experimental result in which the contact angles expressing the lyophilic characteristic and the repellency characteristic are measured for a panel substrate (referred to as "comparison material 1") in which the surface of the bank is made to have the repellency characteristic by the fluorocarbon plasma treatment after the lyophilic treatment is carried out to the surface of the pixel electrode (including the insulation layer exposed in the EL device forming region) by the oxygen plasma treatment and a panel substrate (referred to as "comparison material 2") in which the surface of the pixel electrode is made to have the lyophilic characteristic again by the oxygen plasma treatment after the lyophilic treatment and the repellency treatment same as in the comparison material 1 is carried out to the panel substrate.

First, the condition (plasma treatment condition) for the lyophilic treatment (including the re-lyophilic treatment) and the repellency treatment which is carried out to the panel substrate according to the comparison materials 1 and 2 and the embodiment will be described. Here, regarding the lyophilic treatment and the repellency treatment (plasma treatment) shown hereinafter, a description is given for the case where the plasma ashing apparatus OPM-SQ1000E manufactured by Tokyo Ohka Kogyo Co., Ltd. is used.

In the panel substrate according to the comparison material 1, first, the oxygen plasma treatment is carried out to the pixel electrode including the ITO in which the exposure portion is set by the opening provided in the insulation film including the silicon nitride film and the insulative substrate in which the bank having polyimide on the insulation film is formed under the condition where the high frequency output (RF power) is 300 W, the oxygen gas flow setting is 800 sccm, the degree of vacuum in the treatment chamber (chamber) is 1.2 Torr, the temperature of the stage where the substrate is mounted is 45° C. and the treatment time is 2 min as shown in Table 1. Thereafter, the fluorocarbon ($CF_4$) plasma treatment is carried out under the condition where the high frequency output (RF power) is 50 W, the $CF_4$ gas flow setting is 80 sccm, the degree of vacuum in the treatment chamber is 0.4 Torr, the stage temperature is 45° C. and the treatment time is 20 sec. That is, in the panel substrate according to the comparison material 1, only the lyophilic treatment by the oxygen plasma treatment and the repellency treatment by the fluorocarbon plasma treatment are carried out under the above condition.

TABLE 1

<Plasma treatment condition for comparison material 1>

| | Oxygen plasma treatment | $CF_4$ plasma treatment |
|---|---|---|
| RF power | 300 W | 50 W |
| Gas flow setting | 800 sccm | 80 sccm |
| Degree of vacuum | 1.2 Torr | 0.4 Torr |
| Stage temperature | 45° c. | 45° c. |
| Treatment time | 2 min | 20 sec |

Moreover, in the panel substrate according to the comparison material 2, the oxygen plasma treatment and the fluorocarbon plasma treatment are carried out to the pixel electrode, the insulation films and the insulative substrate in which the bank is formed under the treatment condition similar to that of the comparison material 1, and thereafter the oxygen plasma treatment is carried out again under the condition where the high frequency output (RF power) is 50 W, the oxygen gas flow setting is 40 sccm, the degree of vacuum in the treatment chamber is 0.4 Torr, the stage temperature is 45° C. and the treatment time is 15 sec as shown in Table 2. That is, in the panel substrate according to the comparison material 2, the lyophilic treatment by the oxygen plasma treatment, the repellency treatment by the fluorocarbon plasma treatment, and the lyophilic treatment (re-lyophilic treatment) by the oxygen plasma treatment are carried out.

TABLE 2

<Plasma treatment condition for comparison material 2>

| | Oxygen plasma treatment | $CF_4$ plasma treatment | Oxygen plasma treatment |
|---|---|---|---|
| RF power | 300 W | 50 W | 50 W |
| Gas flow setting | 800 sccm | 80 sccm | 40 sccm |
| Degree of vacuum | 1.2 Torr | 0.4 Torr | 0.4 Torr |
| Stage temperature | 45° c. | 45° c. | 45° c. |
| Treatment time | 2 min | 20 sec | 15 sec |

On the other hand, in the panel substrate (insulative substrate 11) according to the embodiment, the oxygen plasma treatment and the fluorocarbon plasma treatment are carried out to the pixel electrode, the insulation films and the insulative substrate in which the bank is formed under the treatment condition similar to that of the comparison material 1, and thereafter, the nitrogen plasma treatment is carried out under the condition where the high frequency output (RF power) is 50 W, the nitrogen gas flow setting is 0.1 L/min, the degree of vacuum in the treatment chamber is 0.4 Torr, the stage temperature is 45° C. and the treatment time is 15 sec as shown in Table 3. That is, in the panel substrate according to the embodiment, the lyophilic treatment by the oxygen plasma treatment, the repellency treatment by the fluorocarbon plasma treatment and the lyophilic treatment (re-lyophilic treatment) by the nitrogen plasma treatment are carried out.

TABLE 3

<Plasma treatment condition for the embodiment>

| | Oxygen plasma treatment | $CF_4$ plasma treatment | Nitrogen plasma treatment |
|---|---|---|---|
| RF power | 300 W | 50 W | 50 W |
| Gas flow setting | 800 sccm | 80 sccm | 0.1 L/min |
| Degree of vacuum | 1.2 Torr | 0.4 Torr | 0.4 Torr |
| Stage temperature | 45° c. | 45° c. | 45° c. |
| Treatment time | 2 min | 20 sec | 15 sec |

Figure 9:
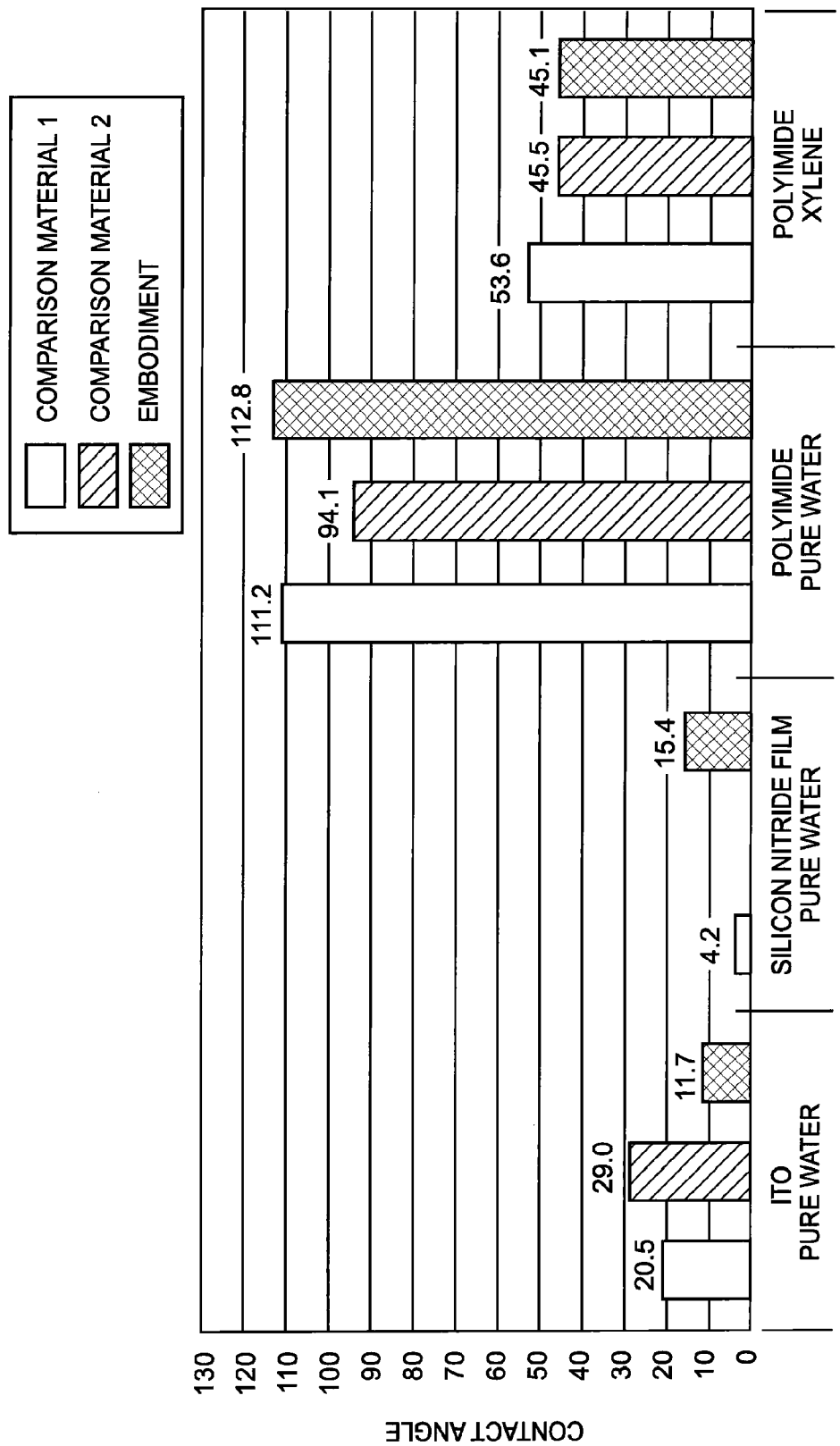
FIG. 9 is a graph showing a measurement result of contact angles in panel substrates according to the embodiment and comparison materials.

FIG. 9 is a graph showing a measurement result of the contact angles on the panel substrate according to the embodiment and the comparison materials. Here, in order to clearly show the measurement result of the embodiment and the comparison materials 1 and 2, the hatching is conveniently carried out to a portion of data.

In the panel substrate according to the embodiment and the comparison materials 1 and 2 in which the plasma treatment (the lyophilic treatment and the repellency treatment) is carried out under the above mentioned treatment condition, the contact angles were measured by using pure water which is used for the organic compound containing liquid (aqueous solution) to be applied to form the carrier transport layer (the hole transport layer and the electron transporting light emission layer) in the above described manufacturing method of the display apparatus and the xylene which is used for the organic compound containing liquid (organic solution) to be applied to form the electron transporting light emission layer within the carrier transport layer, and a result as shown in FIG. 9 is obtained.

As shown in FIG. 9, in the panel substrate according to the comparison material 1, the pure water contact angle was 20.5° on the ITO surface which forms the pixel electrode and was 4.2° on the silicon nitride film surface. On the other hand, the pure water contact angle was 111.2° on the polyimide surface which forms the bank. That is, the surfaces of the ITO and the silicon nitride film can be made to have the lyophilic characteristic with respect to the organic compound containing liquid (aqueous solution) for forming the carrier transport layer by carrying out the fluorocarbon plasma treatment to the pixel electrode including the ITO, the insulation film including the silicon nitride film and the entire surface of the panel substrate in which the bank including the polyimide is formed after carrying out the oxygen plasma treatment to them, and further the surface of the polyimide can be made to have the repellency characteristic. The pure water contact angle on the ITO surface is 20.5° being relatively large. Although this contact angle of 20.5° achieves the guideline of the lyophilic characteristic of about 40° or smaller, it cannot be said that the lyohpilic characteristic is preferable because the contact angle is greater than the more preferable pure water contact angle of about 10°.

It is considered that this is due to the hydrophilicity of the ITO surface which is once made to have the lyophilic characteristic is degraded by carrying out the repellency treatment by the fluorocarbon plasma treatment after carrying out the lyophilic treatment by the oxygen plasma treatment. More particularly, because the polyimide in which the etching is carried out on the surface of the bank at the time of repellency treatment is accumulated on the pixel electrode (ITO) surface, the lyophilic characteristic of the pixel electrode surface is degraded. It is considered that it is not an effect of residual that occurs when the photosensitive resin layer is processed by the partition wall forming process.

In order to prove this, the pure water contact angle on polyimide and the ITO when the repellency treatment by the fluorocarbon plasma treatment is independently carried out to each of the substrate (patterning substrate) in which the ITO is formed on the glass substrate (insulative substrate) and in which the polyimide patter is processed and the cut out portion (only the ITO) which is only the portion (no polyimide pattern) where the ITO is formed is cut out from the substrate are measured and an result as shown in Table 4 is obtained. In the substrate in which patterning is carried out to the polyimide (patterning substrate), the pure water contact angle is 97.0° on the polyimide surface showing a high repellency characteristic, and the contact angle on the ITO surface is 22.3°. On the other hand, when the cut out portion of the substrate where the ITO is formed is cut out from the substrate and when the repellency treatment is carried out under the same condition (only the ITO), the pure water contact angle on the ITO surface is 9.0° showing a high lyophilic characteristic. From the above, it is confirmed that the lyophilic characteristic on the ITO surface is degraded by the effect of polyimide near the ITO. Here, the lyophilic characteristic in the silicon nitride film does not degrade as the ITO surface by the surface of the silicon nitride film being etched by the repellency treatment by the fluorocarbon plasma.

TABLE 4

| <Pure water contact angle (°)> | | |
|---|---|---|
|  | ITO | polyimide |
| Patterning substrate | 22.3 | 97.0 |
| Only-ITO substrate | 9.0 | — |

Moreover, as shown in FIG. 9, in the panel substrate according to the comparison material 2, the pure water contact angle of 29.0° is obtained on the ITO surface, and the pure water contact angle of 94.1° is obtained on the polyimide surface. That is, after the oxygen plasma treatment is carried out to the entire surface of the panel substrate in which the pixel electrode and the bank are formed, the ITO surface can be made to have the lyophilic characteristic with respect to the organic compound containing liquid (aqueous solution) and the polyimide surface can be made to have the repellency characteristic with respect to the organic compound containing liquid (aqueous solution) by carrying out the fluorocarbon plasma treatment to the entire surface of the panel substrate and by further carrying out the oxygen plasma treatment. However, the lyophilic characteristic and the repellency characteristic of the comparison material 2 are reduced comparing that of the above described comparison material 1, although the pure water contact angle on the ITO surface have reached 29.0° and the pure water contact angle on the polyimide surface have reached 94.1° and the guide line of the lyophilic characteristic (about 40° or smaller) and the guide line of the repellency characteristic (about 50° or greater) are achieved by the comparison material 2.

In such way, when the fluorocarbon plasma treatment is carried out to make the polyimide (bank) have the repellency characteristic after the oxygen plasma treatment is carried out to make the ITO (pixel electrode) have the lyophilic characteristic as in the comparison material 1, it is determined that the lyophilic characteristic of the ITO is degraded. Further, when the fluorocarbon plasma treatment is carried out to make the polyimide (bank) have the repellency characteristic after the oxygen plasma treatment is carried out to make the ITO (pixel electrode) have the lyphilic characteristic and when further the oxygen plasma treatment is carried out to make the ITO (pixel electrode) regain the lyphilic characteristic as in the comparison material 2, it is determined that both the lyphilic characteristic of the ITO and the repellency characteristic of the polyimide are degraded.

As shown in the above described embodiment, in the present invention, the fluorocarbon plasma treatment is carried out to make the polyimide (bank) have the repellency characteristic after the oxygen plasma treatment is carried out to make the ITO (pixel electrode) have the lyphilic characteristic and further the nitrogen plasma treatment is carried out to make the ITO (pixel electrode) regain the lyphilic characteristic. In such way, as shown in FIG. 9, the pure water contact angle of 11.7° is obtained on the ITO surface and the pure water contact angle of 15.4° is obtained on the nitride silicon film surface, and the pure water contact angle of 112.8° is obtained on the polyimide surface.

That is, it is determined that a good lyphilic characteristic can be realized by greatly approximating the pure water contact angle of the ITO surface with respect to the organic compound containing liquid (aqueous solution) for forming the carrier transport layer to about 10° which is a more preferable value, and that a good repellency characteristic can be realized by greatly increasing the pure water contact angle on the polyimide surface. Further, although the lyphilic characteristic is degraded because the pure water contact angle of the nitride silicon film surface is somewhat greater than that in the case of the comparison material 1, the pure water contact angle of the nitride silicon film surface can achieve the above mentioned guideline of the lyophilic characteristic which is about 40° or smaller.

The contact angle (xylene contact angle) of xylene which is used for the organic compound containing liquid (organic solution) for forming the electron transporting light emission layer to be provided at the upper layer of the hole transport layer within the carrier transport layer on the polyimide (bank) is measured, and 53.6° is obtained in the case of comparison material 1, 45.5° is obtained in the case of comparison material 2 and 45.1° is obtained in the case of the embodiment as shown in FIG. 9. A significant difference was not found.

Subsequently, the occurrence rate of defect (print irregularity and pin hole) when the organic compound containing liquid (aqueous solution) for forming the carrier transport layer (for example, the hole transport layer) in the panel substrate according to the above described embodiment and the comparison material 1 will be described.

Figure 10A:
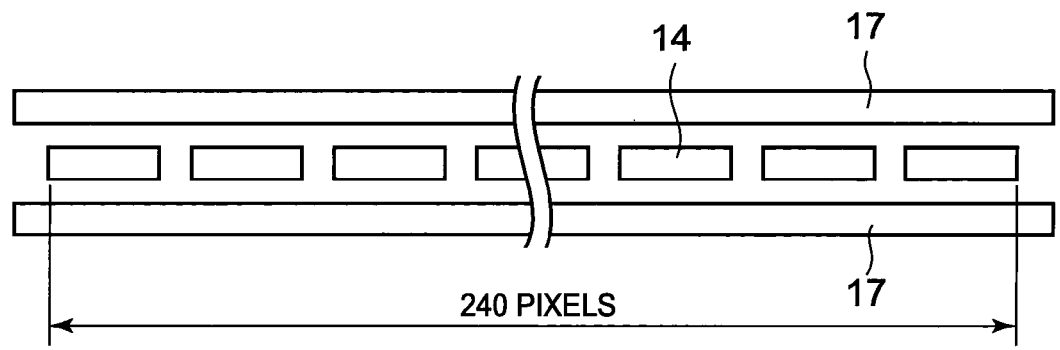
FIG. 10A is a schematic view for explaining an experimental condition for testing an occurrence rate of defect when an organic compound containing liquid is applied to the panel substrate.
Figure 10B:
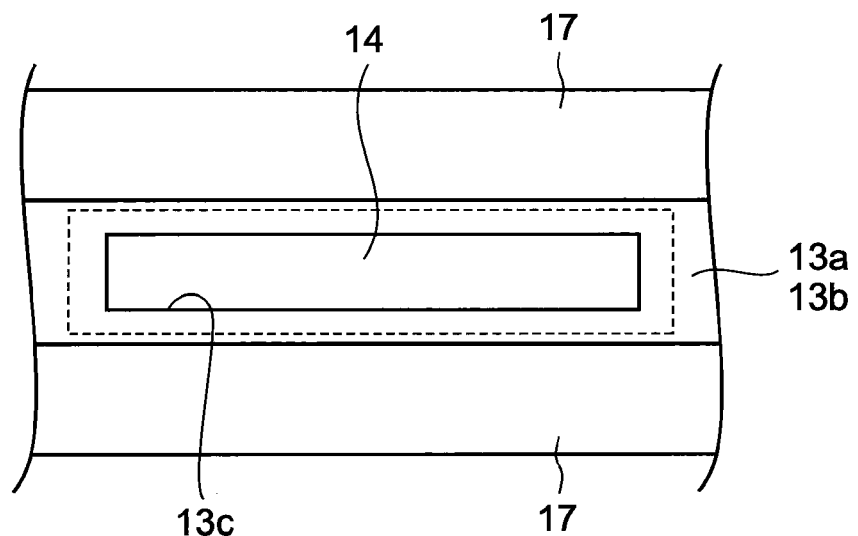
FIG. 10B is a schematic view for explaining an experimental condition for testing an occurrence rate of defect when an organic compound containing liquid is applied to the panel substrate.
Figure 11A:
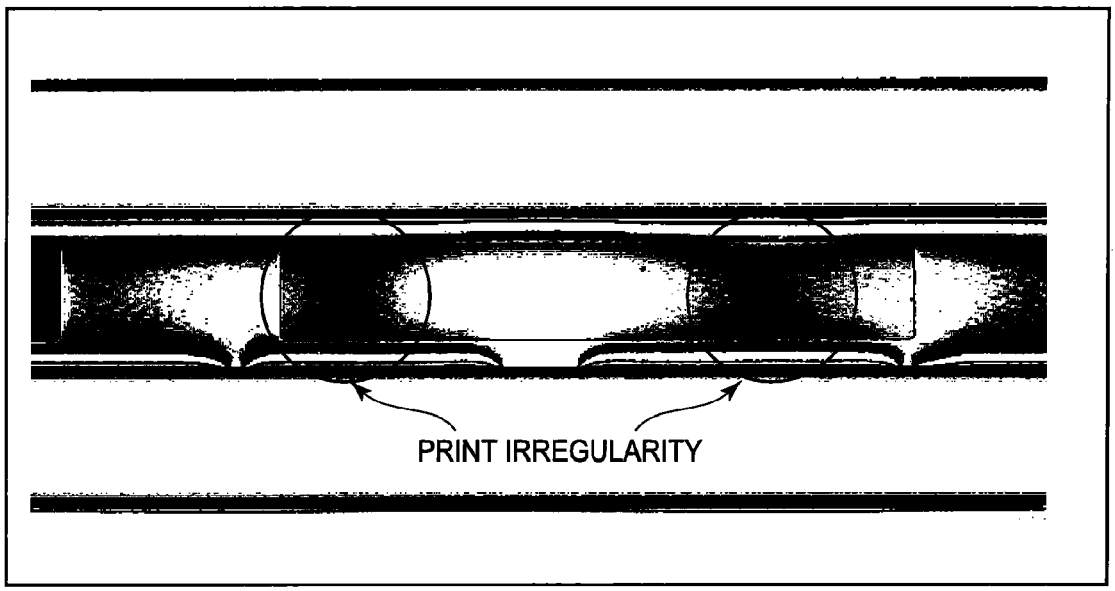
FIG. 11A is a microscope photograph showing an occurring condition of defect (print irregularity) in the panel substrates according to the embodiment and comparison material 1.
Figure 11B:
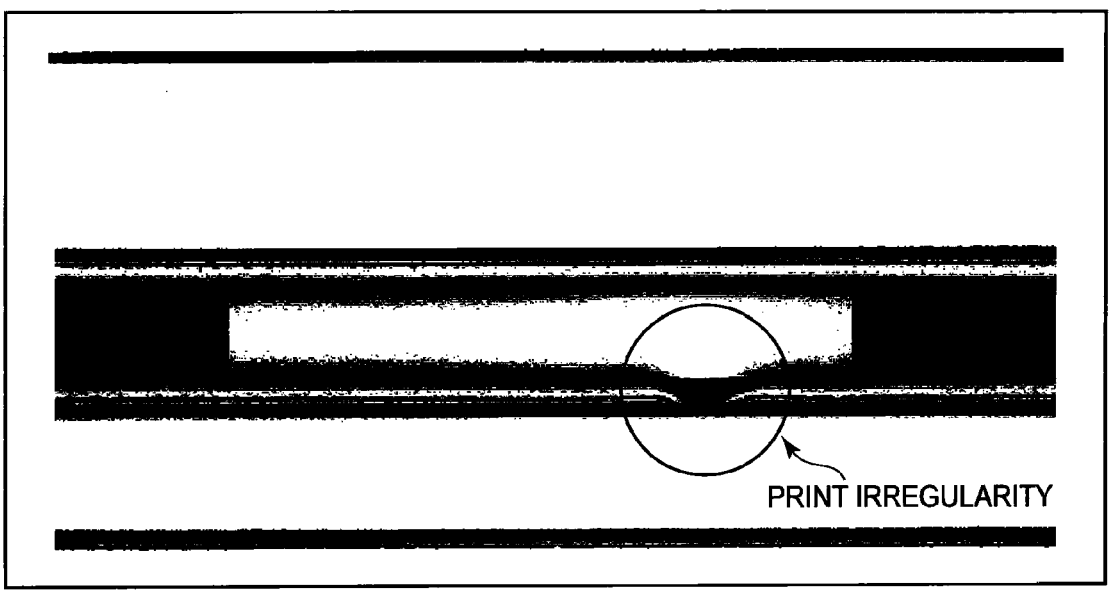
FIG. 11B is a microscope photograph showing an occurring condition of defect (print irregularity) in the panel substrates according to the embodiment and comparison material 1.

FIGS. 10A and 10B are schematic views for explaining an experimental condition for testing an occurrence rate of defect when an organic compound containing liquid is applied to the panel substrate, and FIGS. 11A and 11B are microscope photographs showing an occurring condition of defect (print irregularity) in the panel substrate according to the embodiment and a comparison material 1.

Here, in the panel substrate according to the comparison material 1 in which the lyophilic characteristic of the ITO (pixel electrode) and the repellency characteristic of the polyimide (bank) can be made to be relatively high among the above described comparison materials 1 and 2 and the panel substrate (insulative substrate) according to the embodiment, the occurrence condition of a defect (print irregularity and pin hole) will be tested for the case where the upper surfaces of a plurality of pixel electrodes 14 including the ITO which are arranged in a straight line are exposed via the openings 13c formed in the insulation films 13a, 13b including the silicon nitride film and where the organic compound containing liquid (aqueous solution) for forming the carrier transport layer is applied to the region (corresponding to the above mentioned EL device forming region Rel) enclosed by a pair of bank 17 including polyimide so as to have the exposed portion of the pixel electrode 14 in the middle and the organic compound containing liquid is dried.

When the organic compound containing liquid (that is an aqueous solution in which PEDOT/PSS is dispersed) for forming the hole transport layer is used as the organic compound containing liquid and when the organic compound containing liquid is continuously applied to the 240 pixels (pixel electrode 14) which are arranged in a straight line in the region (EL device forming region Rel) enclosed by the bank 17 by sweeping the pixels once by the nozzle printing method, the occurrence ratio of defect (print irregularity and pin hole) is that the defect was observed in 240 pixels among 240 pixels (that is, all of the pixels) in the panel substrate according to the comparison material 1. On the other hand, defect was observed only in 2 pixels among 240 pixels in the panel substrate according to the embodiment.

Particularly, in the panel substrate according to the comparison material 1, the pixel electrode 14 repels the organic compound containing liquid which is applied to the surface of the pixel electrode 14 exposed from the opening 13c of the insulation films 13a, 13b and the print irregularity in which the film thickness of the carrier transport layer (hole transport layer) is uneven occurs frequently as shown in FIG. 11A. On the other hand, in the panel substrate according to the present invention, it is discovered that occurrence of the print irregularity as shown in FIG. 11A is greatly reduced and only very small print irregularity as shown in FIG. 11B occurs slightly.

From the result, according to the manufacturing method of the display apparatus of the embodiment of the present invention, the repellency characteristic of the bank surface including polyimide can be maintained and also the lyophilic characteristic of the pixel electrode surface including the ITO can be improved by making the bank surface have the repellency characteristic by carrying out the fluorocarbon plasma treatment after making the pixel electrode surface have the lyophilic characteristic by carrying out the oxygen plasma treatment and then further carrying out the nitrogen plasma treatment in the panel substrate in which the pixel electrode including the ITO and the bank including polyimide are formed. Therefore, the occurrence of the print irregularity and the pin holes when the organic compound containing liquid is applied is reduced and the carrier transport layer having an even film thickness can be formed. Further, the light emission irregularity, shifting in brightness and deterioration in the organic EL device which occur due to the light emission drive current concentrates to flow in the area where the film thickness of the organic EL layer is thin when the organic EL device (light emitting element) is operating so as to emit light are prevented and a good display image quality can be realized and the product yield can be improved.

Here, in the above testing of the effect, a description is given for the case where the oxygen plasma treatment is carried out in the process (lyophilic process) to make the surface of the pixel electrode 14 have the lyophilic characteristic. However, the present invention is not limited to this, and for example, other lyophilic treatment such as the UV ozone treatment can be carried out as described in the above manufacturing method according to the embodiment. In such case, approximately the same effect as the effect obtained by carrying out the oxygen plasma treatment can be obtained.

Moreover, in the above testing of the effect, a description is given for the case where the inert gas plasma treatment is carried out by using $CF_4$ as fluorocarbon gas in the process (repellency process) to make the surface of the bank 17 have the repellency characteristic. However, the present invention is not limited to this, and any one of $C_4F_8$, $C_4F_6$, $CHF_3$, $C_3F_8$, and $C_2F_6$ may be used as fluorocarbon gas. In such case, approximately the same effect as the effect obtained by using $CF_4$ as fluorocarbon gas can be obtained.

Moreover, in the above testing of the effect, a description is given for the case where the nitrogen plasma treatment is carried out in the process (re-lyophilic process) to make the surface of the pixel electrode 14 have the lyopilic characteristic again. However, the present invention is not limited to this, and the plasma treatment using an inert gas other than nitrogen such as argon gas may be carried out. In such case, approximately the same effect as the effect obtained by carrying out the nitrogen plasma treatment can be obtained.

Moreover, in the above testing of the effect, a result of the contact angles of pure water and xylene which are measured when polyimide is used as the bank is shown. However, the present invention is not limited to this, other transparent electrode material such as IZO may be used as the pixel electrode, and other photosensitive resin material such as acrylic may be used as the bank. In such case, approximately the same effect as the effect obtained by using the ITO as the pixel electrode and using polyimide as the bank can be obtained.

Furthermore, in the above described embodiment, a description is given for the case where the organic EL layer 15 is constituted with the hole transport layer 15a and the electron transporting light emission layer 15b. However, the present invention is not limited to this, and for example, the organic EL layer 15 may be constituted with only the hole transporting/electron transporting light emission layer, the organic EL layer 15 may be constituted with the hole transporting light emission layer and the electron transport layer, and the organic EL layer 15 may be constituted with the hole transport layer, the electron transport layer and the light emission layer. Further, the organic EL layer 15 may be constituted by having the carrier transport layer arbitrary intervening between each of the layers, or the organic EL layer 15 may be a combination of other carrier transport layers.

Moreover, in the above described embodiment, a description is given for the case where the display panel has the bottom-emission type light emission structure. However, the present invention is not limited to this, and the display panel may have the top-emission type light emission structure. In such case, the pixel electrode 14 has an electrode structure in which the reflecting electrode layer having the light reflecting characteristic such as aluminum, chromium or the like and the transparent electrode layer having light transmittance characteristic such as the ITO or the like which covers the reflecting electrode layer are layered in a stacking manner, and the counter electrode 16 needs to be formed with a conductive material having the light transmittance characteristic such as the ITO or the like.

Further, in the above described embodiment, the anode electrode is used for the pixel electrode 14. However, it is not limited to this, and the cathode electrode may be used for the pixel electrode 14. Here, the organic EL layer 15 needs to be a layer in which the carrier transport layer adjacent to the pixel electrode 14 is the electron transporting layer.

Furthermore, in the above described embodiment, the display panel 10 of an active drive which comprises the pixel drive circuit DC shown. However, it is not limited to this, and the display panel 10 may be a display panel of a passive drive.

The entire disclosure of Japanese Patent Application No. 2007-240627 filed on Sep. 18, 2007 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A manufacturing method of a display apparatus which comprises a plurality of display pixels including light emitting elements having a carrier transport layer, comprising:

first causing a surface of an electrode, which is formed in a forming region of the plurality of display pixels that is enclosed by a partition wall which is provided on a substrate, to have a lyophilic characteristic by carrying out an oxygen plasma treatment with a first RF power for a first treatment time;

making a surface of the partition wall have a repellency characteristic; and second causing the surface of the electrode to have the lyophilic characteristic again by carrying out a plasma treatment to the entire substrate in an inert gas atmosphere with a second RF power that is lower than the first RF power for a second treatment time that is shorter than the first treatment time.

2. The manufacturing method of the display apparatus according to claim 1, wherein in the making, the surface of the partition wall is made to have the repellency characteristic to an organic solution including a carrier transporting material by carrying out a plasma treatment to the partition wall in a fluorocarbon gas atmosphere.

3. The manufacturing method of the display apparatus according to claim 1, wherein in the second causing, the surface of the electrode is made to have the lyophilic characteristic to an organic solution including a carrier transporting material by carrying out the plasma treatment in a nitrogen gas atmosphere or in an argon gas atmosphere.

4. The manufacturing method of the display apparatus according to claim 1, wherein the partition wall is formed by photosensitive resin material of a polyimid system or an acrylic system.

5. The manufacturing method of the display apparatus according to claim 1, wherein the partition wall is formed on an insulation film including a silicon nitride film or a silicon oxide film formed on the substrate between forming regions of the display pixels.

6. The manufacturing method of the display apparatus according to claim 1, wherein the forming region of the display pixels is defined by the partition wall.

7. The manufacturing method of the display apparatus according to claim 1, further comprising:

forming the carrier transport layer by applying an organic solution including a carrier transporting material on the electrode which is caused to have the lyophilic characteristic again and drying the organic solution; and forming a counter electrode which opposes electrodes of the plurality of display pixels via the carrier transport layer and which is formed so as to extend on the partition wall which is made to have the repellency characteristic.

8. The manufacturing method of the display apparatus according to claim 1, wherein the carrier transport layer comprises a plurality of layers.

9. The manufacturing method of the display apparatus according to claim 1, wherein the electrode includes ITO.

10. The manufacturing method of the display apparatus according to claim 1, further comprising:

forming the carrier transport layer by applying an organic solution including a carrier transporting material on the electrode which is caused to have the lyophilic characteristic again and drying the organic solution.

11. A manufacturing method of a display apparatus which comprises a plurality of display pixels including light emitting elements having a carrier transport layer, comprising:

first causing a surface of an electrode formed in a forming region of the plurality of display pixels by being enclosed by a partition wall which is provided on a substrate to have a lyophilic characteristic to an organic solution including a carrier transporting material by carrying out an oxygen plasma treatment with a first RF power for a first treatment time;

making a surface of the partition wall have a repellency characteristic; and second causing the surface of the electrode to have the lyophilic characteristic again by carrying out a plasma treatment in an inert gas atmosphere with a second RF power that is lower than the first RF power for a second treatment time that is shorter than the first treatment time.

12. The manufacturing method of the display apparatus according to claim 11, wherein in the making, the surface of the partition wall is made to have the repellency characteristic to the organic solution including the carrier transporting material by carrying out a plasma treatment to the partition wall in a fluorocarbon gas atmosphere.

13. The manufacturing method of the display apparatus according to claim 11, wherein in the second causing, the surface of the electrode is made to have the lyophilic characteristic to the organic solution including the carrier transporting material by carrying out the plasma treatment in the inert gas atmosphere.

14. The manufacturing method of the display apparatus according to claim 11, wherein the partition wall is formed by photosensitive resin material.

15. The manufacturing method of the display apparatus according to claim 11, wherein the partition wall is formed on an insulation film including a silicon nitride film or a silicon oxide film formed on the substrate between the forming regions of the display pixels.

16. The manufacturing method of the display apparatus according to claim 11, wherein the forming region of the display pixels is defined by the partition wall.

17. The manufacturing method of the display apparatus according to claim 11, further comprising:

forming the carrier transport layer by applying the organic solution including the carrier transporting material on the electrode which is caused to have the lyophilic characteristic again and drying the organic solution.

18. The manufacturing method of the display apparatus according to claim 17, further comprising:

forming a counter electrode which opposes the electrode of the plurality of display pixels via the carrier transport layer and which is formed so as to extend on the partition wall.

19. The manufacturing method of the display apparatus according to claim 11, wherein the carrier transport layer is constituted with a plurality of layers.

20. The manufacturing method of the display apparatus according to claim 11, wherein the electrode includes ITO.

21. The manufacturing method of the display apparatus according to claim 1, wherein the first RF power is 300 W, the first treatment time is 2 minutes, the second RF power is 50 W, and the second treatment time is 15 seconds.

22. The manufacturing method of the display apparatus according to claim 11, wherein the first RF power is 300 W, the first treatment time is 2 minutes, the second RF power is 50 W, and the second treatment time is 15 seconds.

* * * * *